US006706448B1

(12) United States Patent
Gole et al.

(10) Patent No.: US 6,706,448 B1
(45) Date of Patent: Mar. 16, 2004

(54) METHOD AND APPARATUS FOR LITHIATING ALLOYS

(75) Inventors: James L. Gole, Atlanta, GA (US); Frank P. Dudel, Huntsville, AL (US)

(73) Assignee: Georgia Tech Research Corp., Atlanta, GA (US)

( * ) Notice: Subject to any disclaimer, the term of this patent is extended or adjusted under 35 U.S.C. 154(b) by 280 days.

(21) Appl. No.: 09/812,060

(22) Filed: Mar. 19, 2001

Related U.S. Application Data

(63) Continuation-in-part of application No. 09/385,994, filed on Aug. 30, 1999, now Pat. No. 6,203,853.

(51) Int. Cl.$^7$ .......................... H01M 4/58; C23C 16/06; C22F 1/00
(52) U.S. Cl. .............................. 429/231.95; 429/231.9; 429/218.1; 429/209; 427/250; 148/512
(58) Field of Search .......................... 429/231.95, 209, 429/218.1, 231.9; 427/250; 148/512

(56) References Cited

U.S. PATENT DOCUMENTS

| | | | | |
|---|---|---|---|---|
| 4,374,163 | A | | 2/1983 | Isenberg ..................... 427/253 |
| 4,507,189 | A | | 3/1985 | Doi et al. .................... 204/192 |
| 4,514,275 | A | | 4/1985 | Shimada et al. ............. 204/298 |
| 5,354,443 | A | | 10/1994 | Moslehi .................. 204/192.12 |
| 5,698,273 | A | | 12/1997 | Azad et al. .................. 427/566 |
| 5,705,293 | A | | 1/1998 | Hobson ....................... 429/162 |
| 5,725,739 | A | | 3/1998 | Hu ............................ 204/192.3 |
| 5,795,679 | A | * | 8/1998 | Kawakami et al. ......... 429/218 |
| 6,537,701 | B1 | * | 3/2003 | Nimon et al. ........... 429/231.95 |

OTHER PUBLICATIONS

E.A. Starke, T.H. Sanders, and I.G. Palmer, *"New Approaches to Alloy Development in the Al–Li System"*, Jour. of Metals 33, 24–31 (1981).

Ralph Hultgren, R. Orr, J. Anderson, and K.K. Kelley, *Selected Values of the Thermodynamic Properties of Binary Alloys*, American Society for Metals Park, Ohio, 1973.
*Bulletin of Alloy Phase Diagrams*, American Society for Metals, Metals Park, Ohio, 1980–1990, also known as the Journal of Phase Equilibria, vol. 2 & 3.
A.A. Nayeb–Hasemi and J.B. Clark, *Phase Diagrams of Binary Magnesium Alloys*, ASM International, Metals Park, Ohio, 1988.
Thaddeus B. Massalski, Joanne L. Murray, Lawrence H. Bennett, and Hugh Baker, *Binary Alloy Phase Diagrams*, American Society for Metals, Metals Park, Ohio, 1986.
M.H. Bakshi, G.A. Denton, C.P. Flynn, J.C. Boisvert and A.B. Kunz, *Physical Review B, 31* (1985) 4972–4983.
B.A. Movchan and A.V. Demchishin, Fizka Metall. 28, 653 (1969).

(List continued on next page.)

*Primary Examiner*—Patrick Ryan
*Assistant Examiner*—Angela J. Martin
(74) *Attorney, Agent, or Firm*—Thomas, Kayden, Horstemeyer & Risley, LLP.

(57) ABSTRACT

The present invention is generally directed to a system for lithiating alloys. In accordance with one aspect of the invention, a method is provided for performing vapor deposition of a lithium alloy on a substrate comprising the steps of vaporizing a mass of lithium and controllably heating a lithium-soluble element, such as magnesium. The method further includes the step of disposing the lithium-soluble element in the lithium vapor, wherein the lithium vapor promotes the vaporization of the lithium-soluble element to create a combined vapor having intimately mixed constituencies from both the lithium and lithium-soluble element. Finally, the method includes the step of disposing a temperature controlled substrate in the combined vapor, whereby the combined vapor is deposited on the substrate. In accordance with another aspect of the invention, a method is provided for depositing a lithium alloy onto a substrate for producing a lithium alloy electrode, which exhibits enhanced surface diffusion of lithium.

33 Claims, 17 Drawing Sheets

OTHER PUBLICATIONS

John A. Thorton, "*Coating Deposition by Sputtering*", in Deposition Technologies for Films and Coatings—Developments and Applications, by R.F. Bunshah, John M. Blocher, Jr., Thomas D. Bonified, John G. Fish, P.B. Ghate, Birgit E. Jacobson, Donald M. Mattox, Gary E. McGuire, Morton Schwarts, John A. Thornton, Robert C. Tucker, Jr., Noyes Publications, Park Ridge, NJ (1982), pp. 170–243.

G.S. Bales and A. Zangwill, J. Vac. Sci. Technol. 8, 145 (1991).

D.B. Knorr in Material Science Forum, vol. 157–162 (1994) pp. 1327–1336.

T.H. Sanders, B.P. Gu, G.L. Liedl, and K. Mahalingam, Acta Metallurgica 35, 482–98 (1987) and references therein.

T.H. Sanders, S. Jha, and M.A. Dayananda, Acta Metallurgica 35, 473–82 (1987) and references therein.

E.A. Starke, Jr. and T.H. Sanders, Acta Metallurgica 30, 927–39 (1982).

Donald Webster, "*Aluminum–Lithium Alloys*", in Metal Progress, Apr. 1984, pp. 33–37, and references therein.

Roger Grimes, "*Aluminum Alloy Developments for Aerospace*", in Sheet Metal Industries, Dec., 1982, pp. 885–898.

R. Yazami and G. Guerard, J. Power Sources 43, (1993).

D. Guyomard and J.M. Tarascon, J. Electrochem. Soc. 139, 937 (1992).

J. Wang, I.D. Raistrick and R.A. Huggins, J. Electrochem. Soc. 133, 457 (1986).

Y. Iwadate, M. Lassouani, F. Lantelme, and M. Chemia, J. Appl. Electrochem. 17, 385–397 (1987).

* cited by examiner

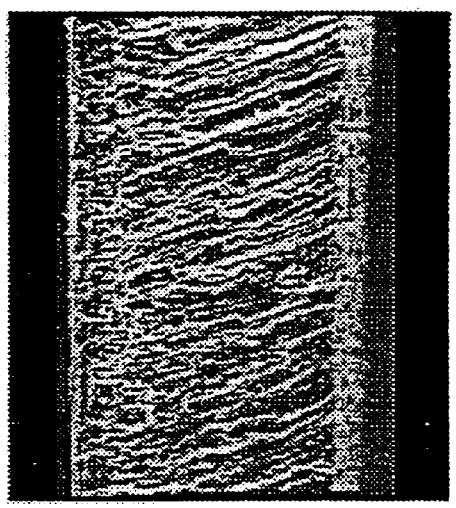
FIG. 7A  FIG. 7B
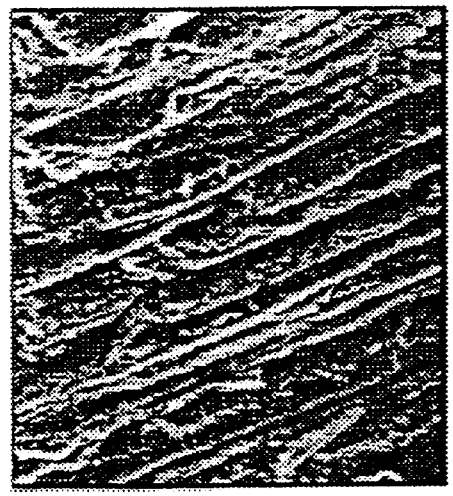
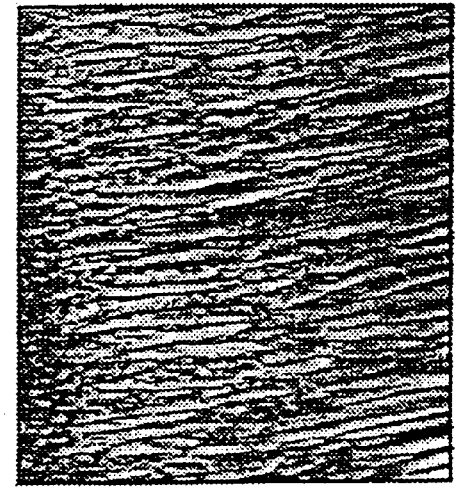
FIG. 7C  FIG. 7D

METHOD AND APPARATUS FOR LITHIATING ALLOYS

CROSS-REFERENCE TO RELATED APPLICATION

This application is a continuation-in-part of U.S. utility application entitled, "METHOD AND APPARATUS FOR LITHIATING ALLOYS," having Ser. No. 09/385,994, filed Aug. 30, 1999 now U.S. Pat. No. 6,203,853, which is entirely incorporated herein by reference.

BACKGROUND OF THE INVENTION

1. Field of the Invention

The present invention generally relates to methods for forming lithium alloys through kinetically controlled lithiation, and more particularly to a technique which simplifies lithium alloy fabrication and the control of alloy morphology through deposition on a temperature regulated substrate.

2. Discussion of the Related Art

A diversity of methods are known for combining materials in the fabrication of alloys or other devices. One of these, molecular beam epitaxy (MBE) is a process that has been applied to the fabrication of magnesium-lithium alloys. However, as is known, molecular beam epitaxy has certain shortcomings, including difficulty in implementation, expense, and time. Molecular beam epitaxy offers a means to control relatively complex fabrication processes but it is subject to rather rigid constraints (when performed properly). As a result, it is a rather expensive process to implement. In addition, growing epitaxial layers through this process is an extremely slow process. When used to combine elements such as magnesium and lithium, the MBE technique maintains relatively low concentration levels so that the magnesium and lithium constituents do not interfere with each other during the depositions process and can be combined on an appropriate substrate.

To date, there is some use of magnesium-lithium alloys in the automotive industry, and there have been suggestions of its possible use in battery technology. The rapid and controlled creation of this alloy and, especially the control of its morphology has offered a challenge to current technology. In some part, this results from the relatively high vaporization temperature of magnesium. Due to its magnesium-oxide (MgO) outer coating, it has been found that a magnesium ingot may be heated to 700 degrees C. and still remain intact.

A shortcoming of the prior art relates to the cycle life of lithium electrode batteries. It has been found that, during lithium battery recharge, the return of lithium ions to the negative battery electrode can lead to dendrite formation. This dendrite formation is believed to be the result of the inability of lithium to diffuse readily into the surface of a lithium electrode. Because of this slow diffusion into the electrode surface and bulk, the deposited lithium can grow out from the electrode as dendrites form. As the battery cycles (discharges/recharges) over time, the dendrite formation continues until one or more dendrites creates a short within an interior cell of the battery. This situation has been addressed with the creation of lithium ion batteries, however, at lessor rate capabilities and energy densities.

In prior art applications, aluminum-lithium alloys are well known. For example, the fuel tanks of the space shuttle use, or intend to use, an aluminum-lithium alloy. This alloy provides a lighter weight alternative, therefore requiring less fuel consumption. It is desirable to reuse these tanks. However, this may be problematic due to the surface heat generated upon re-entry into the earth's atmosphere. As the tanks heat up, lithium can leach out of the aluminum. Accordingly, a technique which can potentially be used to replace the lithium lost to the surface of this and other aluminum-lithium alloys is needed.

With its light weight and optimal diffusivity, lithium incorporation can offer the potential for a wide range of improvements which include the development of new compact battery electrodes, the fabrication of new lower density alloys for the aerospace and automotive industries, the development of new selective catalysts for the oxidative coupling of methane to form $C_{2+}$hydrocarbons, and the creation of pinning sites in superconductors.

Conventionally, lithium alloys have been produced using a direct-alloy method, which involves the melting and vaporizing of mole percent specific mixtures of Li and element(s), or alloy, under vacuum, and depositing the vapor on a substrate.

Accordingly, it is desirable to develop new alloy forming techniques and means to incorporate lithium using approaches which address these and other shortcomings in the prior art.

SUMMARY OF THE INVENTION

Certain advantages, and novel features of the invention will be set forth in part in the description that follows and in part will become apparent to those skilled in the art upon examination of the following or may be learned with the practice of the invention. The objects and advantages of the invention may be realized and obtained by means of the configurations and combinations particularly pointed out in the appended claims.

To achieve its advantages and novel features, the present invention is generally directed to a system for lithiating alloys. In accordance with one aspect of the invention, a method is provided for performing vapor deposition of a lithium alloy onto a substrate comprising the steps of vaporizing a mass of lithium at a controlled temperature while at the same time controllably heating a lithium-soluble element, such as magnesium. The method further includes the step of disposing the lithium-soluble element in the lithium vapor, wherein the lithium vapor promotes the vaporization of the lithium-soluble element to create a combined, intimately mixed vapor having both atoms and a small concentration of molecules from both the lithium and lithium-soluble element. Finally, the method includes the step of interacting the intimately mixed vapor with a temperature controlled substrate, whereby the combined vapor is deposited onto the substrate.

In accordance with the preferred embodiment, the lithium soluble element is magnesium. However, as will be appreciated, other elements may be used in accordance with the invention. For example, silicon, tin, copper, silver and zinc may each be used. In this regard, the lithium soluble element is one that, when disposed in lithium vapor, increases the escaping tendency at its surface (lowers the energy required to escape the surface) allowing atoms or molecules of the soluble element to vaporize and mix with the lithium vapor. By controlling the temperature of the lithium and the lithium soluble element, independently, the ratio of lithium to lithium soluble element in the combined vapor may be closely controlled. In this regard, it is generally preferred to control the lithium temperature within the range of approximately 350 degrees C. to 535 degrees C., and to control the magnesium (when magnesium is used as the lithium soluble element) temperature within the range of approximately 440 degrees C. to 490 degrees C. These temperature ranges can also shift slightly dependent upon the positioning of the lithium, magnesium, and substrate configurations. By way of example, when magnesium is heated to 450 degrees C. and exposed to lithium vapor (at controlled temperatures), the lithium vapor first interacts with the magnesium oxide coating, converting the surface MgO to lithium oxide plus magnesium in the initial phases. Exposure of this surface to lithium and further interaction causes the vaporization of the magnesium at temperatures far below its vaporization temperature. This allows intimate mixing of the magnesium and lithium to form the magnesium-lithium alloy. In addition, the temperature of the substrate onto which the alloy mix is deposited, may be controlled in order to control the nature of the morphology of the magnesium-lithium alloy deposited thereon.

In accordance with another aspect of the present invention, a method is provided for depositing lithium onto an aluminum element surface. This method includes the steps of vaporizing a mass of lithium and exposing the aluminum surface, at very stringent temperature, to the lithium vapor. This technique requires controllably heating an aluminum surface, so that the lithium vapor is deposited on this surface over a very precise temperature range (aluminum 570–590° C., lithium 525 to 585° C.) producing alloys whose lithium content does not exceed 5 wt % lithium.

In accordance with yet another aspect of the invention, an apparatus is described for performing the vapor deposition of a lithium alloy onto a substrate. In this respect, the apparatus includes several variants of lithiation containers for vaporizing and interacting a mass of lithium. These containers further include a mechanism for disposing magnesium and other lithium-soluble elements to a mass of lithium vapor. To form MgLi alloys, a heating element is placed adjacent to the magnesium source, in order to controllably heat the magnesium. Finally, a construction is provided for supporting a substrate above the container in which the lithium and the soluble element interact.

In the preferred embodiment, the apparatus further includes a temperature control mechanism configured to control the temperature of the substrate. By closely controlling the substrate temperature, the morphology of the deposited material may be closely controlled. In one embodiment, the temperature controlling device may be a cooling coil placed adjacent to the substrate surface.

DESCRIPTION OF THE DRAWINGS

The accompanying drawings incorporated in and forming a part of the specification, illustrate several aspects of the present invention, and together with the description serve to explain the principles of the invention. In the drawings:

FIGS. 7A–7E are Scanning Election micrographs illustrating varying surface structures at varying substrate temperatures for Mg-28 wt % lithium alloys;

DETAILED DESCRIPTION OF THE PREFERRED EMBODIMENT

Figure 1:
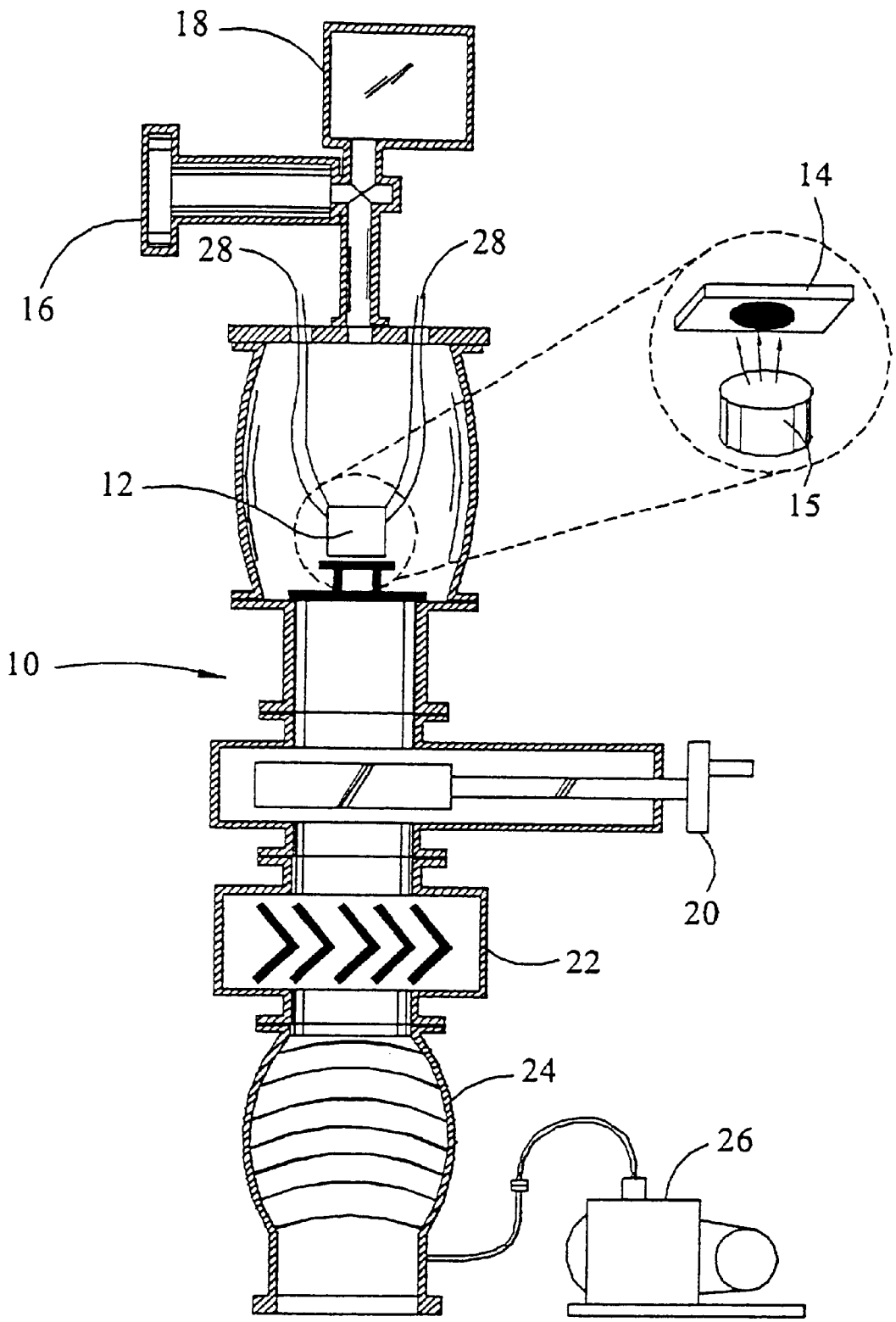
FIG. 1 is a schematic diagram of an experimental configuration for formation of lithium alloys through either solid state diffusion or lithium mediated co-deposition.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

By way of further introduction, it is known that a variety of fabrication techniques coupled with controls on composition and heat treatment play central roles in the development of a wide variety of alloys. In parallel, state-of-the-art technology emphasizes the fabrication of light-weight and compact energy sources and desires to utilize lighter weight components in order to increase the efficiency with which available energy reserves are consumed. These requirements precipitated the development of methods to incorporate the unique properties of elemental lithium into a variety of fabrication processes. With its light weight and significant diffusivity in select alloys, lithium incorporation offers the potential for a wide range of improvements ranging from the development of new compact battery electrodes and the fabrication of new lower density alloys for the aerospace and automotive industries to the development of new selective catalysts.

The illustrated embodiments of the present invention outline simple approaches to the fabrication of magnesium-lithium, zinc-lithium, aluminum-lithium and copper-lithium alloys which are based primarily on kinetic control of the lithiation process and associated with the nature of surface and bulk diffusion. The combination of these factors facilitates intimate gas phase mixing of surface liberated constituents (lithium soluble elements and lithium) or surface lithiation through solid state diffusion. The considered processes: (1) are simpler than normal alloy forming approaches; (2) show the potential to circumvent many of the difficulties inherent to normal lithium alloy processing, avoiding, to significant extent, the complications of oxidation; and (3) may be coupled with polymer based electrolytes to investigate the electrochemical characteristics of a series of lithium alloys as a means of generating the negative electrodes for rechargeable lithium based batteries.

There are two distinct variants to the approaches illustrated herein for lithium alloy formation. In a first example, under certain experimental conditions, lithium vapor can be made to interact with a lithium-soluble element such as a magnesium surface in a process that significantly increases the magnesium vaporization rate, as well as allowing its intimate mixing with the lithium vapor to provide the basis for forming composition controlled magnesium-lithium (Mg—Li) alloys upon deposition to an appropriate substrate. The microstructure, in addition to the composition, of these alloys can be modified during film deposition on the temperature controlled substrate. In a slightly different approach, the surface of metallic aluminum or its alloys may be modified with an impinging lithium vapor, creating an excess lithium content at the surface, which can then be passed into the alloy employing a solid state diffusion controlled process. The procedure is distinct in that it can permit the introduction of the reactive element lithium into the alloy near the final stages in the production of a wrought product.

Discussion of Figures

Turning now to the drawings, FIG. 1 is a diagram depicting a system to produce lithium alloy films employing variations of the physical vapor deposition process. The apparatus 10 typically operates in the $8 \times 10^{-7}$ to $10^{-5}$ Torr pressure range and relies on simple containment vessels 12 configured, with independent temperature control, so as to promote lithium vapor interaction and alloy formation with select metals which have solubility in or can react with lithium (e.g., Magnesium, Aluminum, Copper, Silver, Zinc, Silicon, and Tin). This vessel 12 is also configured to facilitate the deposition of metal-lithium vapor mixtures on a substrate 14 operating under additional temperature control. Finally, it is possible to independently monitor the alloy formation process using the mass spectrometer system 16. Although the illustrated embodiment focuses on the creation of lithium alloys, it will be appreciated that the concepts and teachings of the present invention may be applied to other elements as well, especially to the alkali metals, sodium and potassium.

The ion pump 18 is a device used to maintain a very low pressure, typically $10^{-8}$ Torr or lower in the region of the mass spectrometer. This device, however, which operates by gettering gases can be used during the monitoring of the lithiation process at pressures approaching $10^{-6}$ Torr.

The mass spectrometer 16 is a device which uses electron-impact ionization to monitor the elements such as magnesium, lithium (lithium oxide), aluminum, zinc, copper, or silver by detecting their masses. The gate valve 20 allows the diffusion pump and roughing pump to be isolated from the main chamber so that this chamber can be opened for sample loading, alloy removal, and chamber cleaning and preparation.

The cold cap 22 is used to aid system pumping and to trap stray diffusion pump oil. The Diffusion Pump 24 is used to pump the main chamber to pressures approaching $8 \times 10^{-7}$ Torr (background) and runs during an experiment to maintain pressures below $10^{-5}$ Torr. The Roughing Pump 26 pumps the system down to $\sim 10^{-3}$ Torr initially, allowing the diffusion pump to be turned on. During the experiment, it backs the diffusion pump 24.

As will be described in further detail below, heating elements are associated with the containment vessels. Heating or cooling elements are connected to the substrate. Accordingly, feed-throughs 28 or other means are provided for electrically connecting the heating elements to a current supply and controller (not shown) outside the apparatus 10.

Figure 2A:
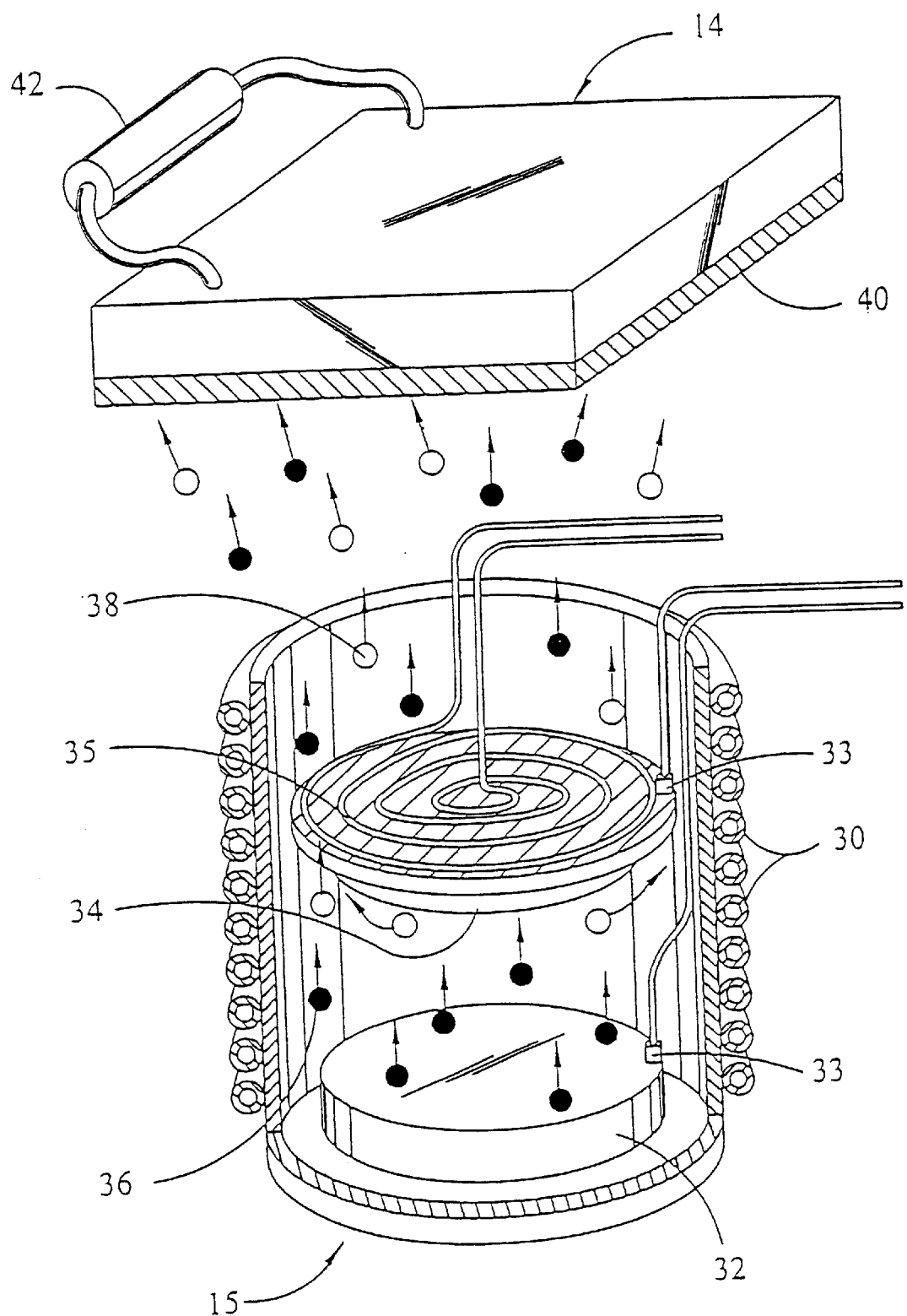
FIG. 2A is a schematic diagram of the configuration type for forming Mg—Li alloys via co-deposition of intimately mixed magnesium and lithium flows.

Reference is now made to FIG. 2A, which shows the containment vessel 15 and substrate 14 of FIG. 1 in more detail. Specifically, FIG. 2A depicts a configuration in which lithium vapor is made to interact with an independently heated magnesium sheet promoting the controlled liberation of magnesium at temperatures far below its melting point, 651 degrees C. This configuration, in particular, facilitates the intimate mixing of magnesium and lithium vapors which can lead to the simultaneous vapor deposition of magnesium and lithium onto a substrate to form a desired magnesium-lithium alloy. As will be appreciated by those skilled in the art, this method is distinct from magnesium-lithium vapor deposition systems in which separate sources are used for each metal in the alloy. The unique process illustrated in FIG. 2A results in the creation of a magnesium vapor at temperatures nearly 200 degrees C. (See Table I) below the magnesium melting temperature and is facilitated by the interaction of lithium vapor with the solid magnesium.

In one embodiment, the containment vessel 15 may be constructed from 304 stainless steel, and may be 5 cm in height and 8 cm in diameter. The outside of the vessel 15 may be wrapped in thermal coax 30 heating element, which can be controlled to readily heat the lithium 32 to temperatures which could be made to exceed 700 degrees C. In fact, the maximum lithium temperature is typically 535–546° C. In this regard, lithium placed in the bottom of the container 15 is melted as its temperature is monitored by a thermocouple 33 placed directly into the melt.

Independently, a magnesium metal disc 34 (greater than 0.005" thick) and an associated tantalum sheet/heating coil/thermocouple 35 configuration is suspended inside the containment vessel 15, above a melted lithium sample 32. As the lithium mass 32 is heated to temperatures beyond the melting point of lithium, it vaporizes 36. As shown, the magnesium disc 34 is disposed within the lithium vapor path (as the vapor 34 rises). The lithium vapor then interacts with the magnesium metal 34 in such a manner as to lower the escape energy of the magnesium (increase the magnesium escaping tendency). In this way, the magnesium metal 34 begins to vaporize 38 at a much lower temperature than it otherwise would. This results in an intimately mixed magnesium/lithium vapor that emanates from the mouth of the container 15.

In the figure, solid circles represent lithium vapor molecules, and hollow circles represent magnesium vapor molecules. The combined vapor mixture can be made to condense onto the temperature controlled substrate 14 to deposit a lithium-magnesium alloy 40 thereon. It will be appreciated that the ratio of lithium to magnesium in the deposited alloy may be controlled by independently controlling the temperature of the liquid lithium 32 and the magnesium disc 34. As the temperature of the lithium is increased, the concentration of lithium in the lithium-magnesium alloy is increased. Likewise, as the temperature of the magnesium disc 34 is increased, the concentration of the magnesium in the lithium-magnesium alloy can be increased. The usual mode of operation involves primarily the adjustment of the lithium temperature.

In the preferred embodiment, the magnesium disc 34 and lithium mass 32 are maintained at two different temperatures (See Table I) using the two control loops of an Omega CN3000 temperature controller. The lithium vapor pressure at the temperature of these experiments ranges from approximately $10^{-3}$ to $10^{-2}$ Torr. The composition of the deposited alloy can be controlled by independently adjusting the magnesium and lithium temperatures. The alloy produced upon deposition to the substrate can be removed and analyzed using a combination of Scanning Electron Microscopy (SEM) on fracture surfaces (discussed below) and Inductively Coupled Plasma-Atomic Absorption Spectroscopy (ICP-AAS) to determine weight % lithium.

Experiments on the magnesium-lithium system demonstrate that the presence of lithium (also other alkalis (sodium, potassium)) vapor enhances the escaping tendency of the surface magnesium metal and, as a result facilitates the intimate mixing of the magnesium and lithium vapors. The effect typically results in the complete vaporization of a 0.025" thick magnesium sheet in less than two hours (entire heating cycle) at temperatures in the range of 450 degrees C. (See Tables I and II). In contrast, in the absence of alkali vapors, the magnesium sheet 34 remains virtually intact over an identical temperature range. By virtue of the manner in which the magnesium vapor is formed and mixed with lithium vapor, an alloy subsequently deposited as the temperature controlled substrate 14 can be shown (SEM, TEM) to have a nearly uniform composition.

The control of deposition and uniformity of composition clearly distinguishes the process from a co-deposition using two beams from independently heated metal sources. Deposition rates are sufficiently rapid (0.02 inches/hour) so as to create semi-thick alloy films. Finally, and as will be discussed below, the temperature of the substrate may be varied from 375 degrees to approximately 20 degrees C. to control the morphology of the grain structure of the vapor deposited film. The lower temperatures are obtained with a cooling device 42 connected directly to the substrate using typically water (approximately 60 to 70 degrees C.) or dry ice cooled methanol (approximately 20 degrees C.) from an appropriate slush bath.

Figure 2B:
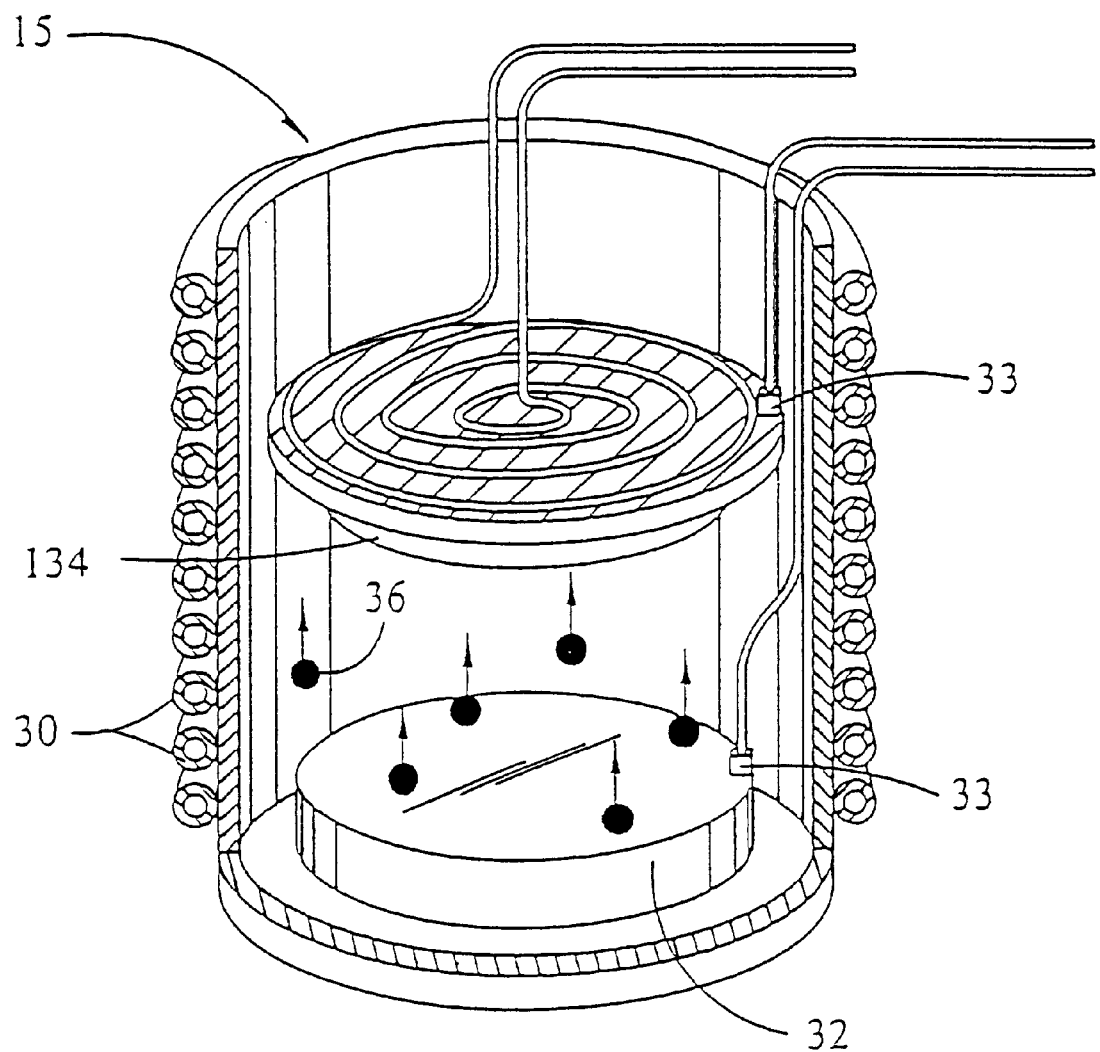
FIG. 2B is a schematic diagram of the configuration for forming Al—Li alloys via solid state diffusion.

Reference is now made to FIG. 2B, which shows a containment vessel 15 for carrying out a similar, but different, process. In the similar process, lithium 32 is deposited and absorbed onto an aluminum 134 surface and can be made to diffuse into the sample to form a desired alloy. This technique is particularly useful when it is desirable to create a lithium enriched surface coating. In this regard, it is preferred that the temperature of the aluminum target, typically a one inch diameter disk of thickness 0.07" produced as a wrought sample from an aluminum casting, be independently controlled over a narrow temperature range notably higher than that of the impinging lithium vapor 36. The aluminum sample 134 is bathed in lithium vapor 36 as both the aluminum 134 and lithium 32 are independently heated.

When the temperature of the aluminum disk is controlled over the very narrow temperature range from 570 to 590° C. and the lithium vapor is maintained at temperatures between preferably 525 and 585° C., it is possible to produce samples which demonstrate a desirable range of lithiation (0.2–5 weight % lithium) and hardness, as the cast aluminum sheet 134 is modified while maintaining its structural integrity. In addition, excess lithium content may be diffused from the surface into the bulk sample using a solid state diffusion process. The best diffusion results are achieved when the aluminum plate 134 is reheated to temperatures between 500 and 550° C., while the lithium vapor 36, which has already begun to alloy, is present at its surface.

Figure 3:
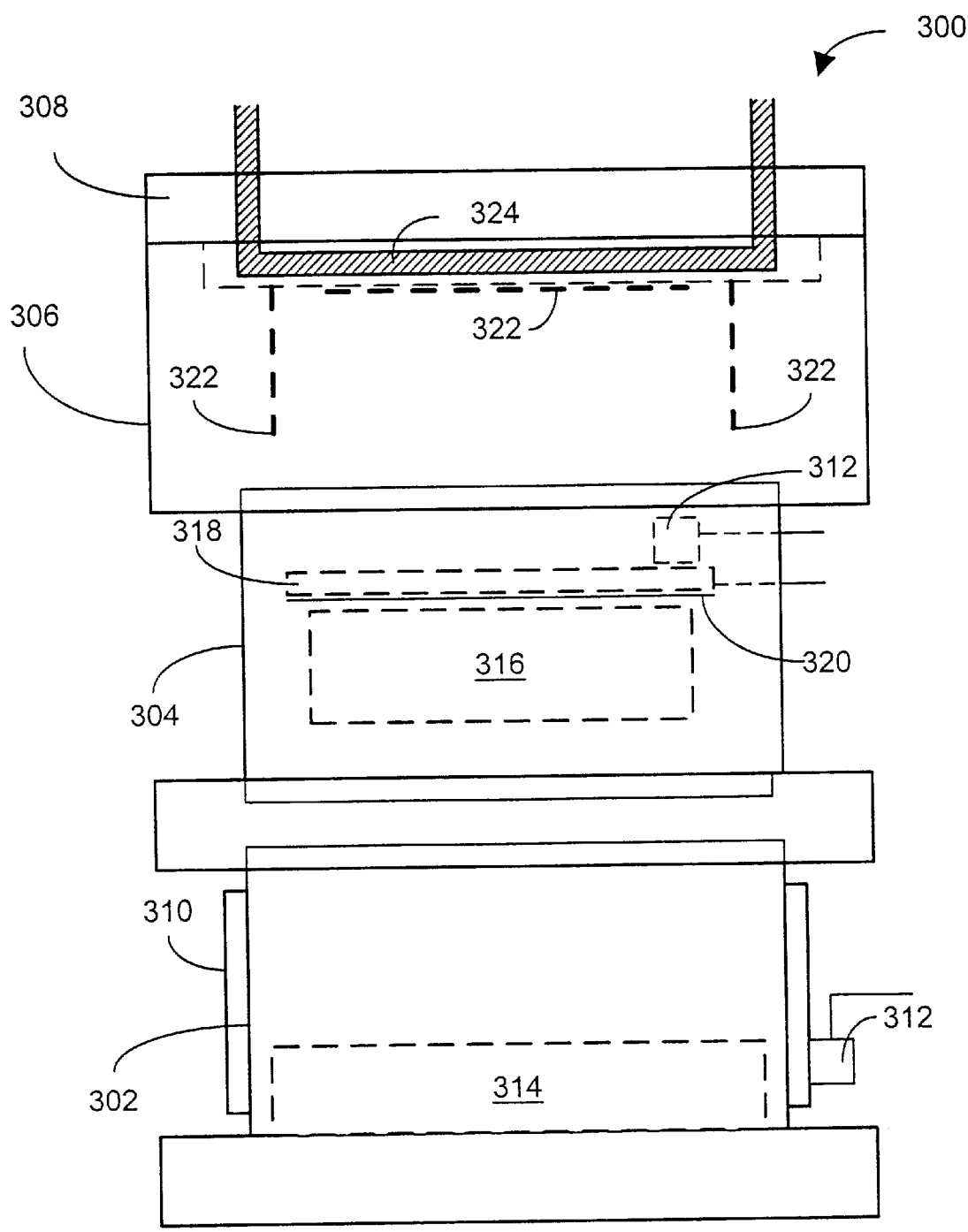
FIG. 3 is a schematic diagram for a containment vessel.

Shown in FIG. 3 is a schematic representation of an alternative containment vessel 300, which includes a crucible region 302, and intermediate reaction region 304, a deposition region 306, and a cap 308, all of which are preferably made of stainless steel. This configuration also enables the intimate mixing of gaseous elements and the deposition of the gaseous elements on substrates disposed in the deposition region 306. The heat flow characteristics of containment vessel 300 differ from the heat flow characteristics of containment vessel 15, and consequently, the operational temperature ranges for the two embodiments also differ.

The crucible region 302 has a generally hollow interior with a first material 314, such as, but not limited to, lithium or other alkali metals, disposed therein. A thermal coax heating element 310 is wrapped around the outside of crucible region 302 and is adapted to heat the crucible region 302 and melt the material 314 disposed therein. The temperature of the thermal coax heating element 310 is monitored by thermocouple 312.

In an alternative embodiment, thermocouple 312 is disposed inside of crucible region 302 and measures the temperature of the material 314. Those skilled in the art will recognize that highly reactive materials, such as lithium, will react with and damage thermocouples disposed within crucible region 302. An appropriate thermocouple used to directly measure the temperature of molten lithium on direct contact would be a platinum-platinum-iridium thermocouple, which is expensive. Whereas, a relatively inexpensive stainless steel thermocouple can be used if it is disposed on the outside of crucible region 302. Therefore, for economic reasons it is generally preferable to dispose the thermocouple 312 on the outside of the crucible region 302 to monitor the temperature of the thermal coax heating element 310.

Above the crucial region 302 and in communication therewith is the generally hollow intermediate reaction region 304 in which a second material 316, such as, but not limited to, magnesium or zinc, is disposed therein. Gaseous metal produced from the heating of the first material 314 in the crucible region 302 rises into the intermediate reaction region 304 and reacts with the second material 316, the second material 316 generally being a material that is soluble to the gas of the first material 314.

The rate at which the second material interacts with the gaseous first material, is controlled in part by controlling the temperature of the second material 316. The second material 316 is heated by heating element 318, and the temperature is monitored by thermocouple 312. Interposing the second material 316 and the heating element 318 is a protective layer 320, which protects the second material 316 from the heating element 318 or vice versa. In an embodiment, protective layer 320 is a sheet of tantalum.

The gaseous elements of the first material and the second material are intimately mixed, and the ratio of these elements can be controlled at least in part by independently controlling the temperatures of the first material 314 and the second material 316.

Disposed above the intermediate reaction region 304 and in communication therewith is the deposition region 306 having at least one substrate 322 disposed therein. The mixing gasses of the first material 316 and the second material 318 rise into the deposition region 306 from the intermediate reaction region 304 and are deposited onto the substrate 322, which in one embodiment is covered with a sheet of tantalum.

Each substrate sheet 322 is in contact with the cap 308, which is disposed on top of the deposition region 306. The cap 308 includes a cooling element 324, which acts as a heat sink, for controlling the temperature of the substrate sheet 322. In the preferred embodiment, the cooling element 324 includes a passage through which a dry ice methanol or alternative slush that can cool the substrate to approximately 15 degrees celsius is passed. The temperature of the substrate 322 is controlled by controlling the temperature of the slush and by controlling the amount of slush passing through the passage.

An advantage of the containment vessel 300 is that it is self contained and can be assembled with the substrate 322, the first material 314 and the second material 316 contained therein and placed inside of the main chamber as one piece. In addition to facilitating ease of use, the containment vessel 300 helps prevent contamination of the experiment. Those skilled in the art recognize that some diffusion pump oil diffuses into the main chamber. The crucible 302, intermediate reaction region 304, the deposition region 306 and the cap 308 are assembled together such that they prevent the combined gaseous mixture and the substrates from being contaminated by the diffusion pump oil.

Furthermore, those skilled in the art will recognize that based upon design choices that there are many variations of containment vessel 300 and that different embodiments might operate at different temperatures. For example, in one embodiment the crucible region might be in intimate contact with a larger heat sink, in which case in order to melt or sublimate the first material the crucible region for this embodiment will need to be heated to a higher temperature than will the crucible region for a different embodiment, which is thermally more isolated or in contact with a smaller heat sink.

Figure 4A:
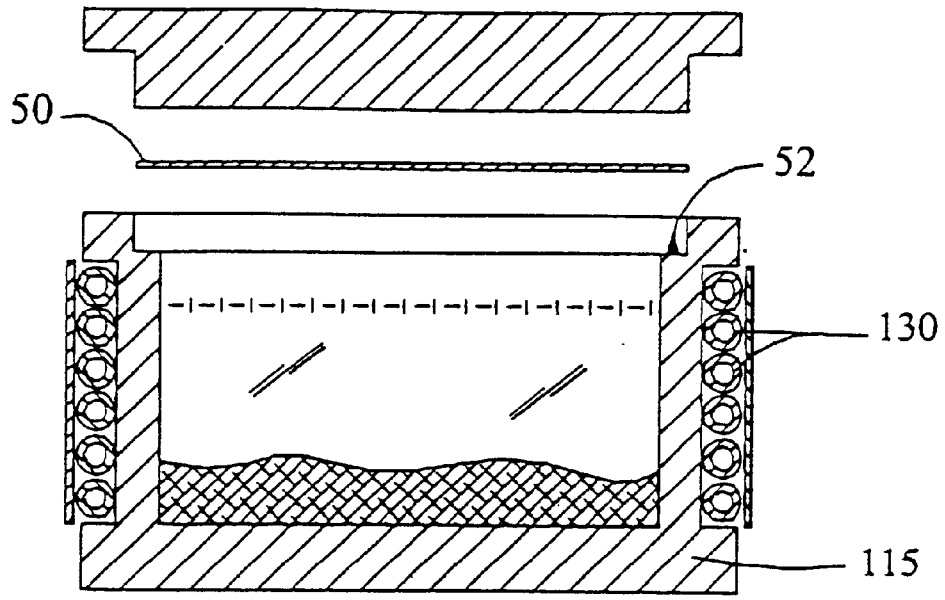
FIG. 4A is a schematic diagram of a configuration for forming Cu—Li alloy crystallites ($Cu_4Li$) from the lithiation of copper foil in a closed containment vessel.
Figure 4B:
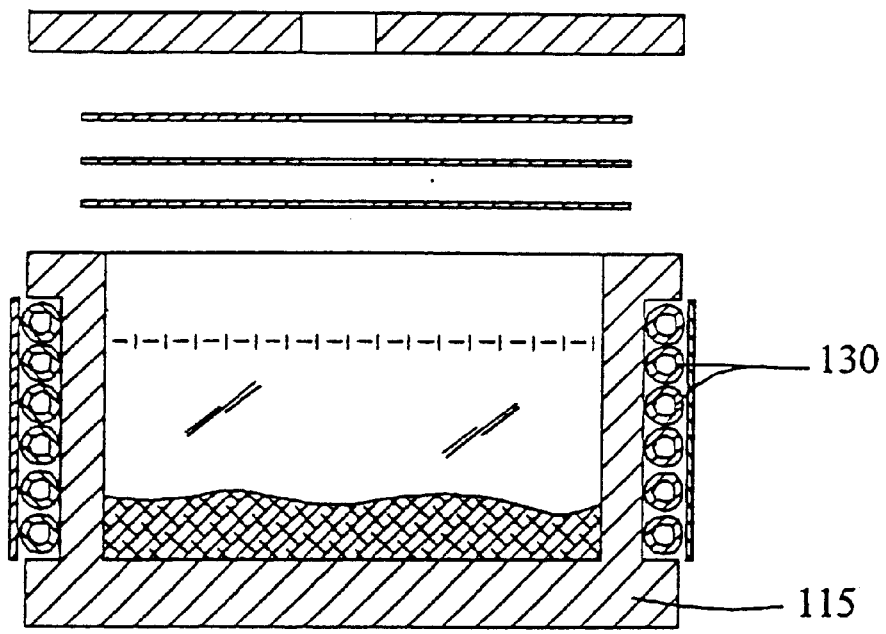
FIG. 4B is a schematic diagram of a configuration for lithiating copper foils to various Cu/Li ratios.

Using variants of the two approaches described in FIGS. 2A, 2B and 3, other lithium based alloys may be created using the configurations depicted in FIGS. 4A and 4B. In this regard, the lithiation of copper foils to generate a series of copper-lithium alloys over a range of composition is depicted. These variable diffusion controlled lithiations generally require that the system be operated over a temperature range from 500 to 600° C. for time frames generally under 20 minutes at these operating temperatures.

The closed configuration of FIG. 4A positions a copper sheet 50 held on a knife edge seal 52 above a lithium charge. As the system (using a heating element 130 e.g., thermal coax) is heated to temperatures between 525 and 550 degrees C., the copper sheet 50 reacts with an impinging lithium vapor and losses its structural integrity. The process, if continued, leads to the conversion of the copper sheet 50 to copper lithium crystallites $Cu_4Li$, which can be found deposited on the bottom of the container 115 after a given run is completed, and, within 20 minutes, to the destruction of the knife edge seal 52.

A triple tiered open configuration is illustrated in FIG. 4B, and provides a means to lithiate the surfaces of copper foils to levels which correspond to a lower lithium incorporation than the limiting $Cu_4Li$ crystallites. This configuration has been operated at temperatures up to 550 degrees C., which corresponds to a lithium vapor pressure near $10^{-2}$ Torr.

Figure 5:
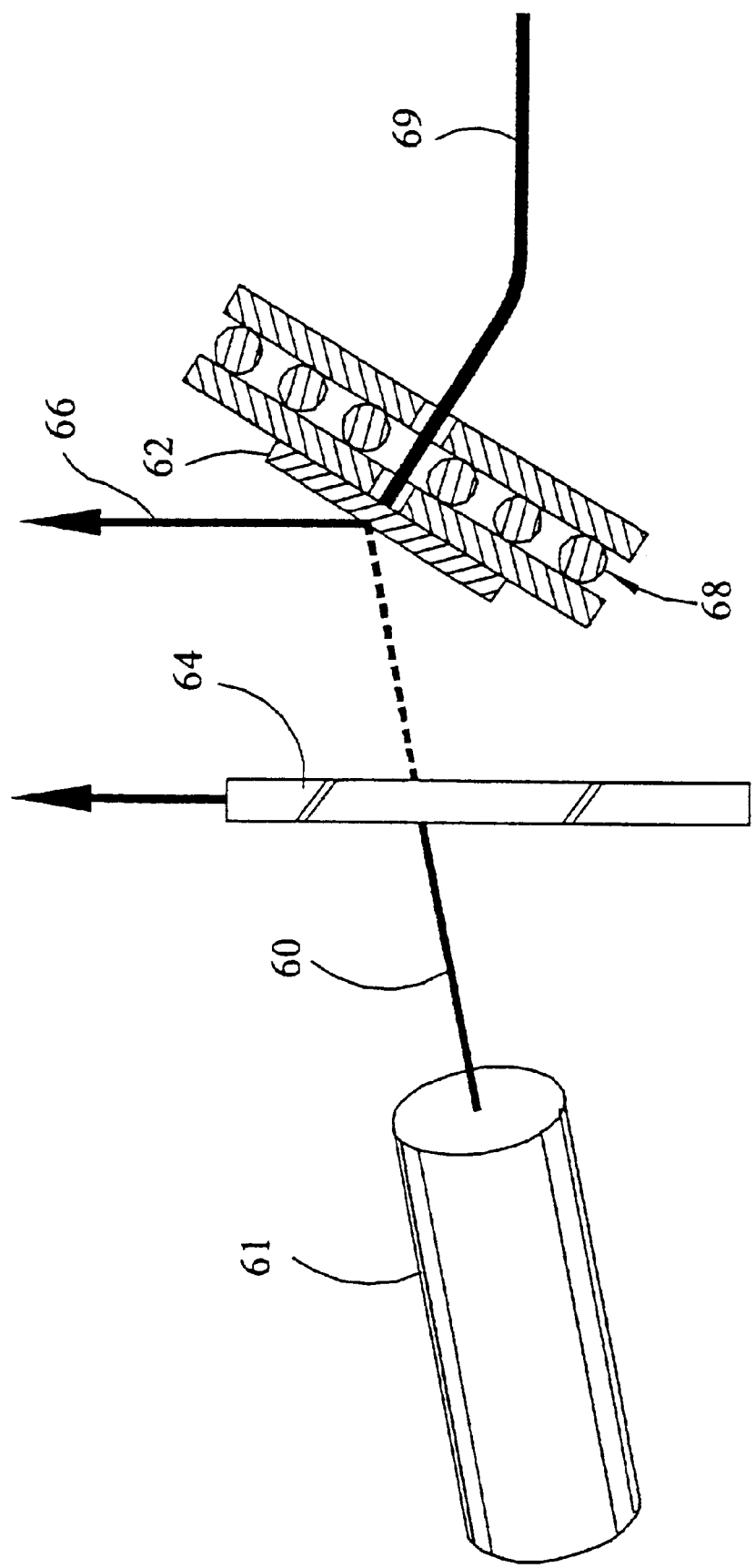
FIG. 5 represents a diagram of an experimental configuration for monitoring enhancement (or suppression) of magnesium evaporation due to an impinging lithium vapor flux.

Reference is now made to FIG. 5, which depicts an experimental configuration which may be used to initiate the study of the effect of lithium atoms (and molecules) colliding with the surface of a magnesium sheet as a function of both variable lithium and magnesium temperature. Here, a lithium vapor flux 60 generated from a lithium source 61 can be made to impinge on the magnesium sheet 62 as the shutter 64 is opened. The magnesium sheet may be heated by, for example, an adjacently disposed thermal coax heater 68. A magnesium flux 66 vaporizing from the surface is then detected with a quadruple mass spectrometer 16 system (shown in FIG. 1).

Film Morphology

Figure 6A:
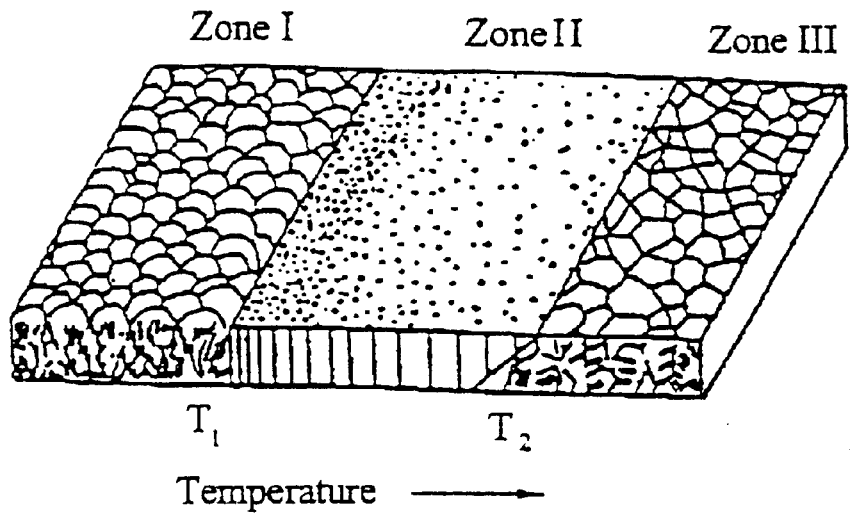
FIGS. 6A and 6B are diagrams illustrating the substrate Structure Zone Model which predicts the influence of substrate temperature on the surface structure of a deposit alloy.
Figure 6B:
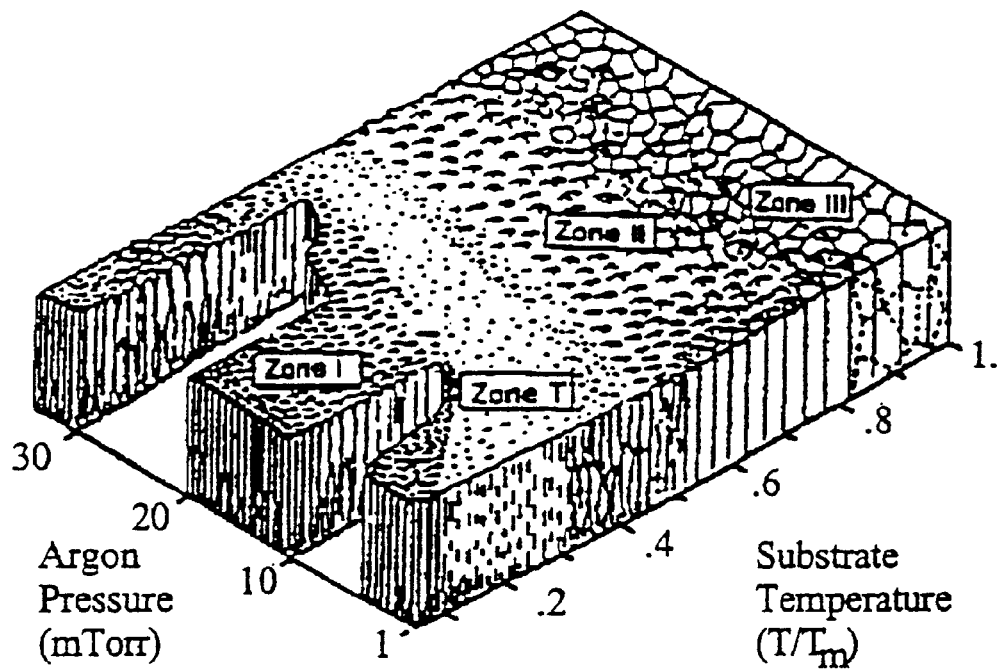

The microstructure and morphology of films have been extensively studied for a wide variety of metals, alloys, and refractory compounds. As is known, thin films deposited from the vapor phase often develop a columnar microstructure. As is further known, models have been developed to explain surface morphologies of deposited films as a function of temperature and pressure. In this regard, FIG. 6A illustrates one of the first models used to describe the evolving microstructure of e-beam deposited thick films. This model, also known as the Structure Zone Model, depends universally on the normalized temperature $T/T_m$, where T is the substrate temperature and $T_m$ is the melting temperature. Similarly, FIG. 6B illustrates an adaptation of the model of FIG. 6A to consider sputtered films. The primary difference in the two models arises when considering complex alloys and refractory compounds. Here, a transition zone, T, between Zones I and II can occur. However, for pure metals and most single-phase alloys, the Zone T is generally not observed.

For the purposes of the preferred embodiment of the present invention, it is important to note that, at lower temperatures, where the surface mobility of atoms is reduced, the Structure Zone Model predicts that growth occurs as tapered crystallites. The structure is not physically dense but contains significant longitudinal porosity. As the substrate temperature is increased, surface mobility increases and eventually the isolated independent tapered columns transform to tightly packed fibrous grains with weak grain boundaries and then to fully dense columnar morphologies, which may take on a wide range as the size of the columnar grains increases with increasing substrate temperature. Finally, as the homogolous temperature, $T=T_m$ is approached, the structure tends to become equiaxed. The crystal structure at thermodynamic equilibrium can eventually be obtained especially following heat treatment.

Magnesium-Lithium Film Generation

For the system configurations depicted in FIG. 2A, the range of operating temperatures used to produce desired Mg—Li alloys are catalogued in Tables I, II (below), and for the system configurations depicted in FIG. 3, the range of operating temperatures used to produce desired Mg—Li alloys are catalogued in Table III (below). Typical operating temperatures for samples 1–12 are confined to a range between approximately 450 and 475 degrees C., for the magnesium and approximately 475–535 degrees C. for lithium, and for samples 13–16 the typical operating temperatures are between approximately 460 and 525 degrees C., for the magnesium and approximately 625–650 degrees C. for the lithium. At these temperatures, the magnesium metal 34 vaporizes as 38 in a lithium environment and can be deposited onto a cooled substrate 14 while intimately mixing with lithium vapor 36 to form a magnesium-lithium alloy 40 film (FIG. 2A). Controlled individual temperature settings during the deposition process determine the composition of the resulting alloy as the data in Table I (below) demonstrate a consistent pattern.

The lithium mediated vaporization of magnesium at temperatures some 200 degrees below the melting point of magnesium does not appear to be readily understood on the basis of the well established magnesium-lithium equilibrium phase diagram, which diagram demonstrates a eutectic point near 23 wt % Li but at 588 degrees C. and a liquidous curve which does not lie below 450 degrees C. for samples of less than 60 wt % Li. Experimental results have produced alloys with lithium contents in the range from 0.08 to 30 weight percent lithium. In addition, it appears possible to generate even higher lithium concentrations by appropriate adjustment of the relative lithium and magnesium temperatures.

TABLE I

Summary of Representative Experimental Conditions for Magnesium-Lithium Alloy Formation

| Sample Number | Mg Temperature (Deg. C) | Li Temperature (Deg. C) | Substrate Temperature (Deg. C) | SEM Appearance[a] | Alloy's Li Content[b] (wt. %) |
|---|---|---|---|---|---|
| 1 | 455–465 | 405–415 | ~330 | Y,C | ~0.2% |
| 2 | 447–453 | 475–480 | 325–335 | Y,C | 3% |
| 3 | 450–455 | 495–500 | 310–335 | Y,C | 6% |
| 4 | 450–460 | 510–515 | 290–315 | Y,C | 12% |
| 5 | 460–464 | 513–517 | 310–340 | Y,I | 22% |
| 6 | 470–485 | 525–530 | 365–385 | Y, CRYS | 26% |
| 7 | 465–480 | 528–534 | 370–385 | Y, CRYS | 28% |
| 8 | 450–465 | 470–500 | 65–90 | Y, C[c] | ND[d] |
| 9 | 450–490 | 450–458 | 60–70 | Y, C[c] | ND[d] |
| 10 | 480–485 | 528–535 | 60–70 | Y, C | 30% |
| 11 | 445–460 | 523–525 | ~20 | Y, CTP | 28% |
| 12 | 456–462 | 522–525 | 30–40 | —[e] | —[e] |

[a]SEM taken with appearance = C for columnar, CRYS for cubic crystalline, CTP for tapered open-porous columnar, I = intermediate.
[b]Determined from Inductively Coupled Plasma - Atomic Absorption Spectroscopy.
[c]Columnar structures are more course than sample 10.
[d]ND, not determined.
[e]Sample ignited.

The experiments on the magnesium-lithium system illustrated in FIG. 2A readily demonstrate the influence of substrate temperature on the morphology of the deposited grain structure. The strong correlation with the Structure Zone Model is illustrated in FIG. 7. In FIG. 7A and 7B, Scanning Electron Micrographs of a Mg-28 wt % Li sample (ICP-AAS) demonstrate the dramatic influence of substrate temperature as it influences the change from an equiaxed microstructure (a cubic crystalline structure), which one might expect from the magnesium-lithium phase diagram, generated at a substrate temperature of approximately 375 degrees C., to a columnar structure when deposition is to a substrate at 60 to 70 degrees C. This striking change continues at lower temperatures, close to 20 degrees C., where tapered columns with clear voids are formed, as predicted by the Structure Zone Model.

Figure 7E:
Figure 8A:
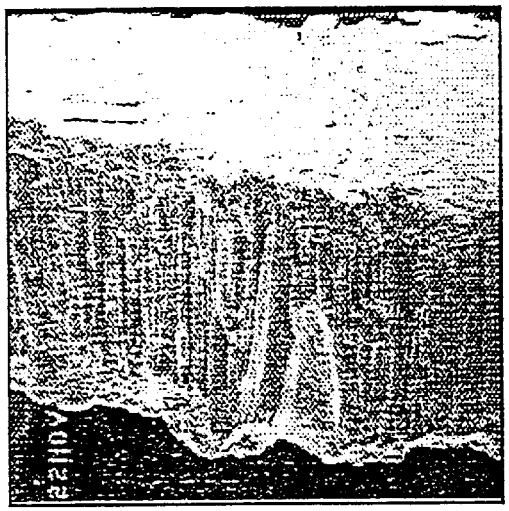
FIGS. 8A–8D are Scanning Election micrographs of magnesium-lithium alloy films of varying lithium weight % deposited at varying temperatures.
Figure 8B:
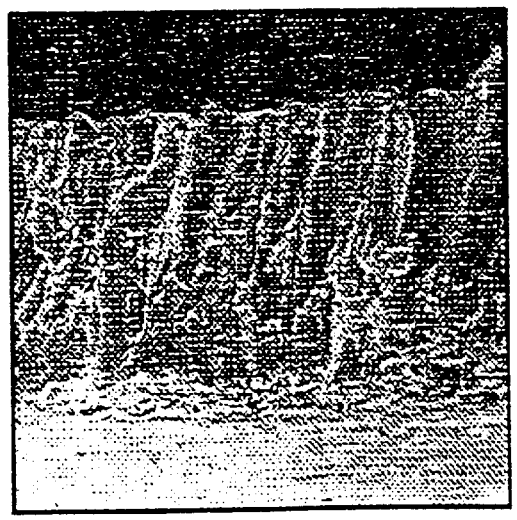
Figure 8C:
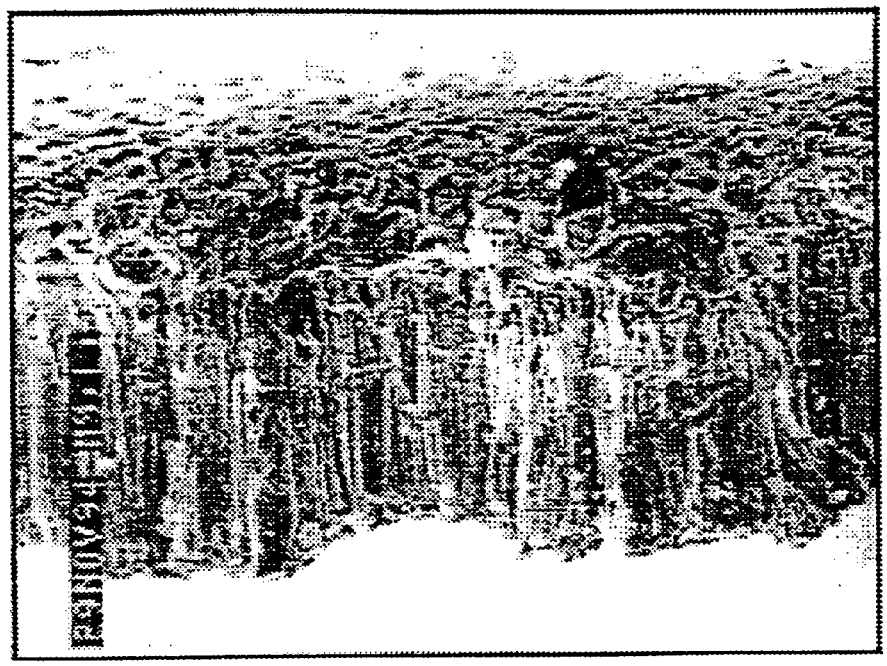
Figure 8D:
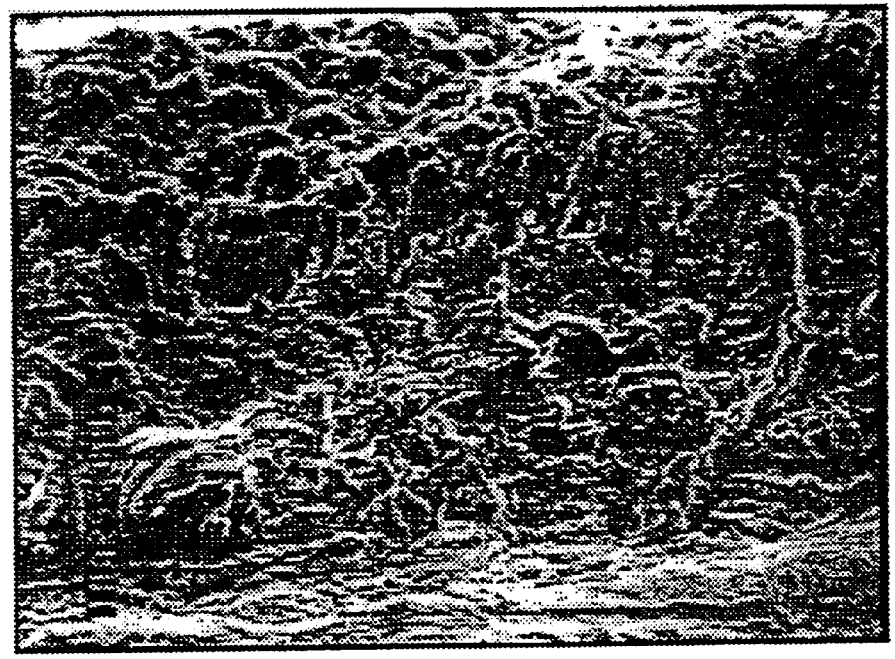

FIGS. 7C and 7D illustrate the evolution in morphology (structure) at a higher level of magnification, and FIG. 7E demonstrates, at even higher magnification, the longitudinal porosity which accompanies the formation of tapered columns on a substrate at 20 degrees C. The apparent validity of those models applicable for thin film deposition to the relatively thick films generated in this study is striking. It is the tapered columnar formation with voids which enhances the potential use of these systems for lithium battery development. In this regard, the tapered columnar structure allows greater surface diffusion. In a lithium battery consisting of a lithium-magnesium negative electrode, an enhanced surface diffusion can help deter the growth of dendrite structures during charging, thereby improving the cycle life of the battery.

The data in Table I (above) also indicate that very small amounts of lithium are necessary to enhance the magnesium vaporization rate. Further, at the lower lithium concentrations in alloy, the structure of the thick film appears columnar.

FIGS. 8A through 8D depict SEM scans, which suggest a transition from a columnar to an equiaxed form at substrate temperatures exceeding approximately 300 degrees C. for alloys of greater than 15 wt % lithium. The uniformity of structure for the films depicted in FIGS. 7B through 7D and FIGS. 8A through 8C suggest a nearly uniform deposition. Finally, the deposition times necessary to produce the lithium alloys are relatively short especially when compared to molecular beam epitaxy. The data summarized in Table II (below) indicate typical run times for several compositions. Here, it is to be noted that the samples are brought slowly to temperature so as to allow the outgassing of impurities such as hydrogen (lithium melt) and absorbed oxygen (magnesium sheet or ingot). This initial preparation—heating cycle occurs over a time span close to 5–6 hours, leaving a run time at the temperature for alloy formation between 1 ½ and 2 hours. It is believed that with improved heating cycle control, the preparative period can be shortened considerably.

TABLE II

Summary of Magnesium Redeposition Results

| Sample Number | Mg Temperature (Deg. C) | Li Temperature (Deg. C) | Substrate Temperature (Deg. C) | Experiment Run Time[a] (hours) | Alloy's Li Content (wt. %) |
|---|---|---|---|---|---|
| 1 | 455–460 | 350–375 | | 5 | 0.08% |
| 2 | 455–465 | 410 | | 6 | 0.23% |
| 3 | 463 | 360–365 | | 5½ | 0.03–0.3% |
| 4 | 450–455 | 495–500 | 310–335 | 5½ | 6 |
| 5 | 450–460 | 510–515 | 290–315 | 7 | 12 |
| 6 | 460–464 | 513–517 | 310–340 | 6½ | 24 |
| 7 | 470–485 | 525–530 | 360–390 | 6½ | 26 |

[a]Deposition period corresponds to 1 1/2–2 hours.

The microstructure and morphology of the alloy films are mainly determined by the substrate temperature, as is demonstrated in FIGS. 9A–9D and 10A–10D, which are further SEM views of Li—Mg samples 13–16, respectively generated using the embodiment of the experimental apparatus described in FIG. 3. Experimental details for experiments involving samples 13–16 can be found in "Electrochemical properties of Li—Mg alloy electrodes for lithium batteries", Journal of Power Sources, 92 (2001), which in incorporated herein by reference. As the substrate temperature is lowered, the microstructure of the deposited film can be made to transform from the cubic crystalline structure characteristic of a phase-equilibrated Li—Mg alloy (with greater than 26 wt. % Li) to a fibrous columnar microstructure and, on further cooling, to a tapered columnar microstructure with extensive voids, as the film transforms from a dense to porous structure. For applications related to lithium batteries, this porous structure is preferred. In addition, based on the experience, which was acquired in handling directly formed Li—Mg alloys, we find that hardness increases with the content Mg in the Li—Mg alloy. A high Mg content in excess of 40 mole % (~70 wt %) renders the alloy too hard to manipulate. It is therefore necessary to produce higher Li content Li—Mg alloy films with the corresponding porous structure and we chose the preparation conditions for the Li—Mg alloy films at sufficiently high lithium temperatures and low substrate temperatures (Table III).

Figure 9:
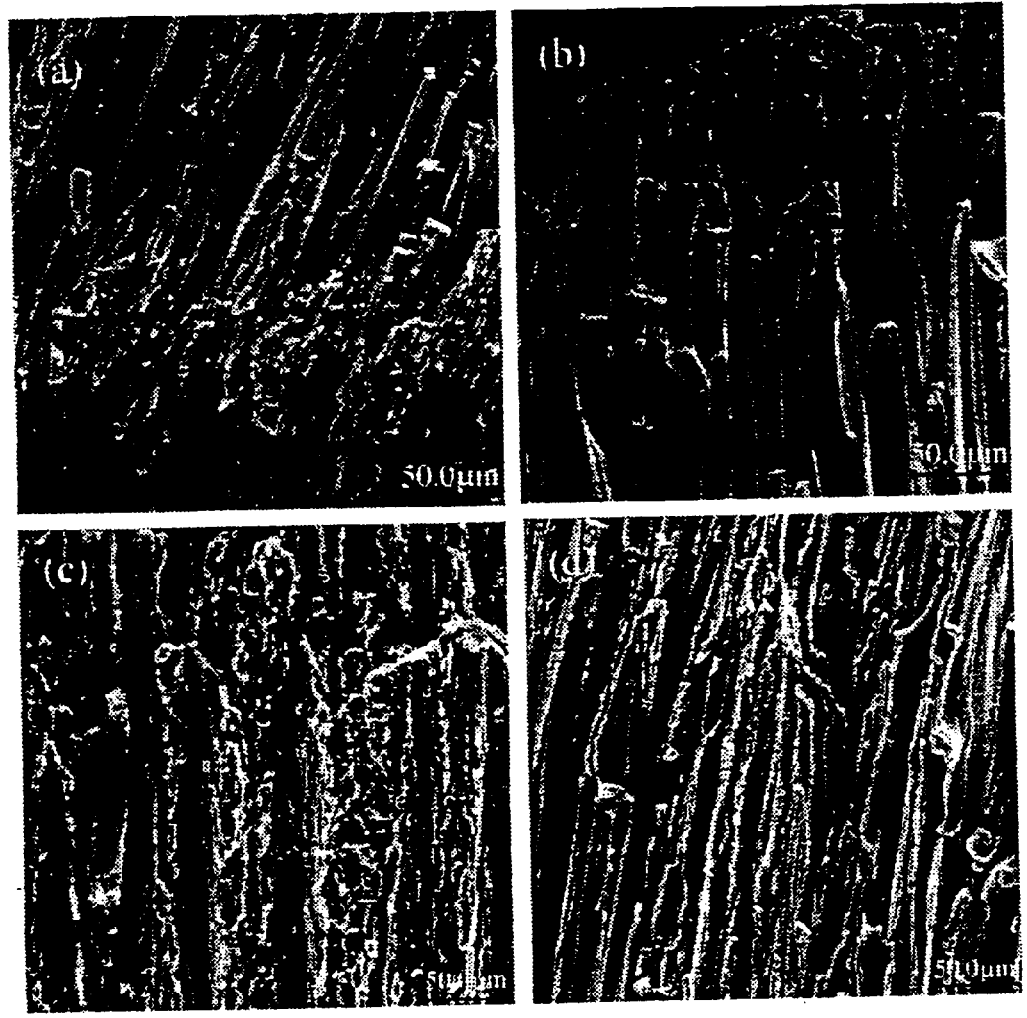
FIGS. 9A–9D are Scanning Election micrographs illustrating varying cross sectional views of magnesium-lithium alloy films deposited at varying temperatures.
Figure 10:
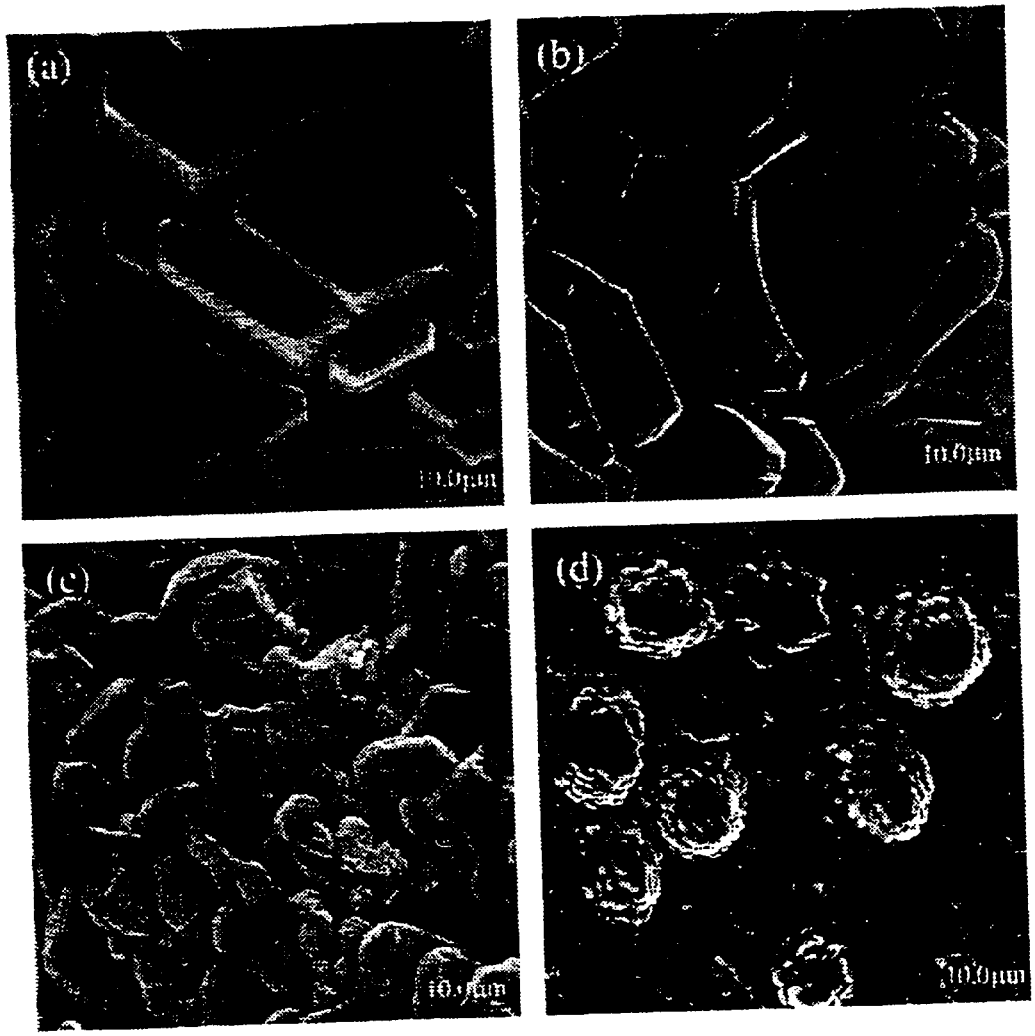
FIGS. 10A–10D are Scanning Election micrographs illustrating varying top views of the magnesium-lithium alloys shown in FIGS. 9A–9D, respectively.

The scanning electron micrographs shown in FIG. 9 correspond to a cross-sectional view of Li—Mg alloy samples 13–16 deposited on a Ta substrate at ~30° C. and ~15° C., respectively. All of samples display a columnar and porous structure. This, of course, is beneficial to the passage of liquid electrolyte into the pores therefore increasing the real contact area between a liquid electrolyte and the Li—Mg alloy electrode surface as the alloy film is used as an anode in lithium batteries. Specifically, under select conditions (e.g., Li temperature 650° C., Mg temperature 460° C., and Ta substrate temperature 15° C.), the obtained alloy (sample 16) possesses a substantially porous structure (FIG. 9D). In fact, the SEM micrographs taken in top-view demonstrate that the morphology of the deposited alloy films varies significantly as a function of substrate temperature. When the substrate temperature is 30° C., the surface of the alloy film appears to be relatively dense, displaying a block-like structure (FIGS. 10A and 10B). A striking change in the surface morphology of the alloy films (FIGS. 10C and 10D), is apparent at the lower substrate temperature, 15° C., as dry ice cooling is used to adjust the temperature of the substrate. These latter samples consist of highly porous surfaces. They clearly have a large real surface area that can facilitate the transport of liquid electrolyte into the Li—Mg alloy electrode.

TABLE III

Summary of representative experimental conditions for Li—Mg alloy formation using the Kinetically Controlled Vapor Deposition method and diffusivity of Li in the alloys as determined using Chronoamperometry

| Sample number | Mg temperature (° C.) | Li temperature (° C.) | Substrate temperature (° C.) | Diffusion coefficient ($\times 10^{-7}$ cm$^2$/s) |
|---|---|---|---|---|
| 13 | 525 | 625 | ~30 | 1.22 |
| 14 | 485 | 635 | ~30 | 1.8 |
| 15 | 485 | 635 | ~15 | 3.91 |
| 16 | 460 | 650 | ~15 | 5.17 |

Figure 11:
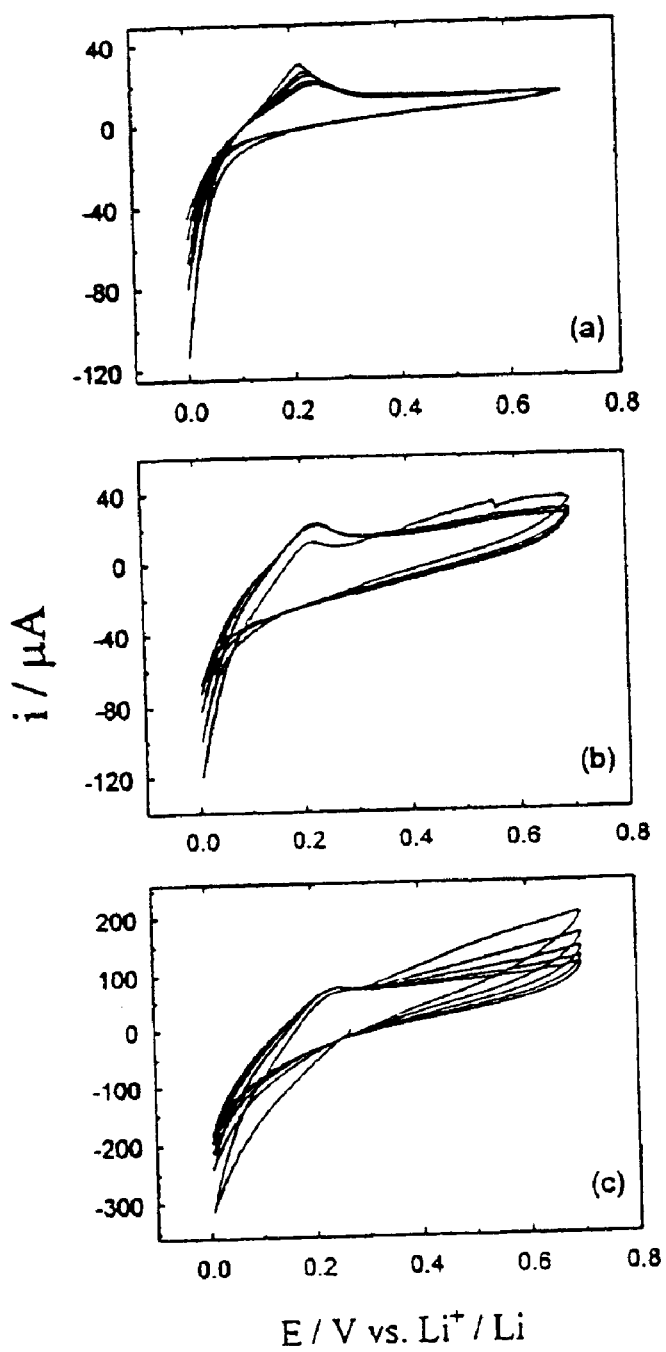
FIGS. 11A and 11C are cyclic voltagrams (CVs) of magnesium-lithium alloy films.

Shown in FIGS. 11A–11C are the cyclic voltammograms (CVs) of the Li—Mg alloys prepared by the KCVD method under the conditions given in Table III for samples 13, 15 and 16, respectively. The CVs were performed in 1M LiN(SO$_2$CF$_3$)$_2$–EC/DMC (1:2 by volume) with a scan rate of 1 mV/s. Although an anodic peak near 0.22V appears on all of the current-voltage (CV) curves, corresponding to the extraction or de-intercalation of Li from the Li—Mg alloys, there are notable differences among these CV curves. For sample 13, shown in FIG. 11A, the anodic peak current decreased gradually as the anodic peak potential shifted in the positive direction with cycling; the cathodic current decreased quickly. In contrast, for samples 14–16, shown in FIGS. 11B and 11C, respectively, the anodic peak current and peak potential remained relatively constant after the first cycle. However, for samples prepared at increasing lithium temperature and decreasing magnesium temperature, the height of the anodic peak current continually reduced, implying a dependence on the composition of the prepared Li—Mg alloys. A similar trend was also observed in studying Li—Mg alloy films prepared using a direct-alloying method; the height of the anodic peak current decreased when the Li content in the alloys was reduced from 90 to 60 mol %. Since the Li—Mg alloy prepared by KCVD at higher Li temperature and lower Mg temperature contains a larger Li concentration, the observation is consistent with previous results. The major difference between the CV curves of the KCVD prepared Li—Mg alloys and those prepared by a direct-alloying method is manifest in the first cycle. A large anodic peak around 0.08 V did not appear in the CV curves for the KCVD prepared Li—Mg alloys, indicating that there is no lithium layer on the surface of the KCVD prepared alloys and that the Li vapor has intimately mixed with the Mg vapor under these preparation conditions. Shown in Table III are the values of $D_{Li}$ in the KCVD generated Li—Mg alloys, as determined using chronoamperometry. It is noted that the $D_{Li}$ values are influenced by the substrate temperature, or in other words, by the microstructure and morphology of the Li—Mg alloy electrodes. The more porous the electrodes, the higher the value of $D_{Li}$. The high diffusivity of lithium in these Li—Mg alloys ($D_{Li}$: 1.22 to 5.9×10$^{-7}$ cm$^2$/s) should be coupled with a significantly enhanced surface diffusion due to the highly porous structures depicted in FIGS. 9 and 10. As a result, the diffusion of lithium in these alloys should be sufficiently fast so that the activity of lithium at the electrode interface will remain less than unity. This suggests that Li—Mg alloy electrodes can be charged or discharged at a higher rate without formation of dendrites and, hence, the lithium batteries based on lithium alloy electrodes will have a higher power density.

Figure 14:
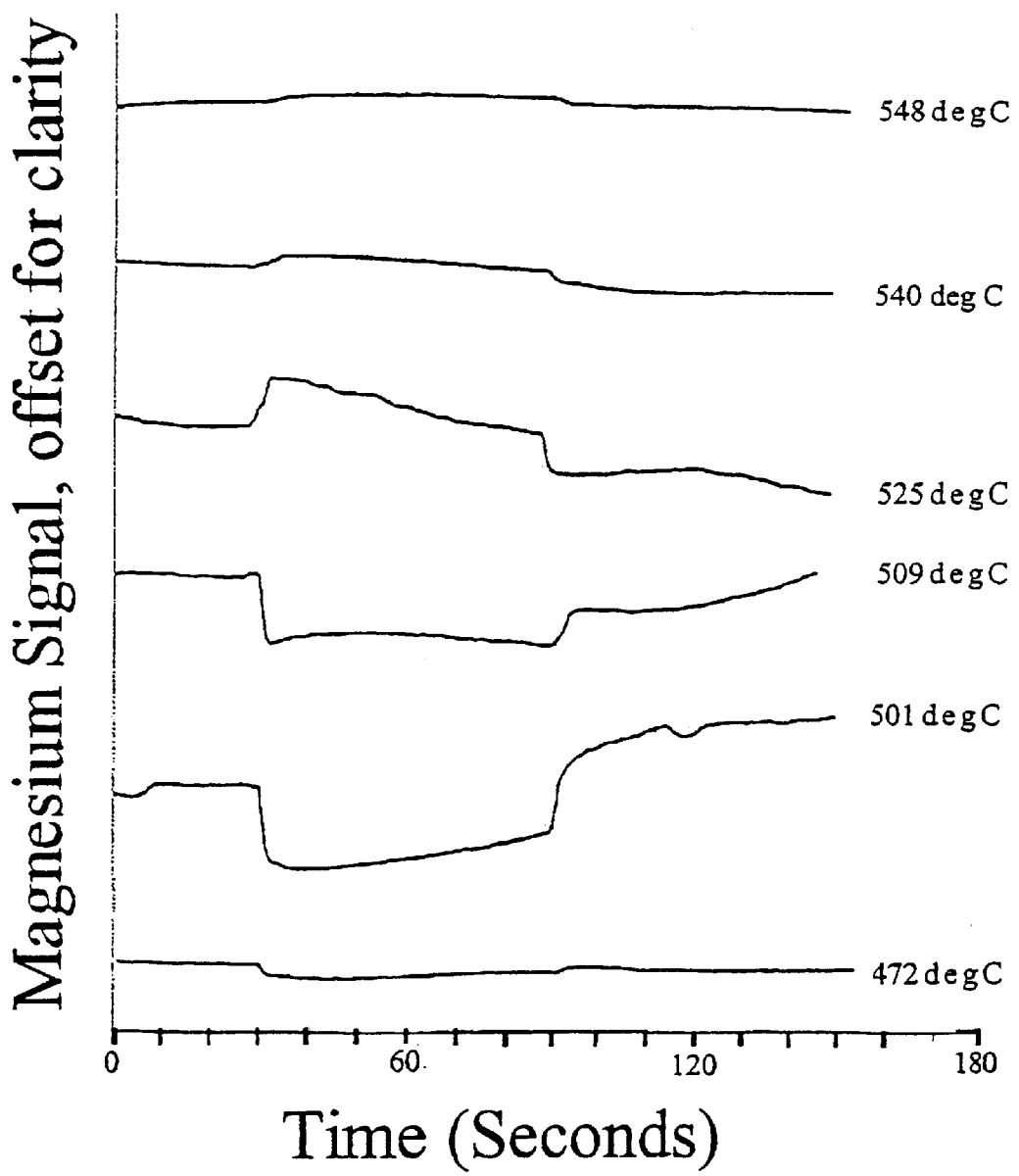
FIG. 14 is a diagram illustrating the magnesium flux signal as a function of the magnesium surface temperature as a lithium flux is allowed to impinge on the magnesium surface.
Figure 15:
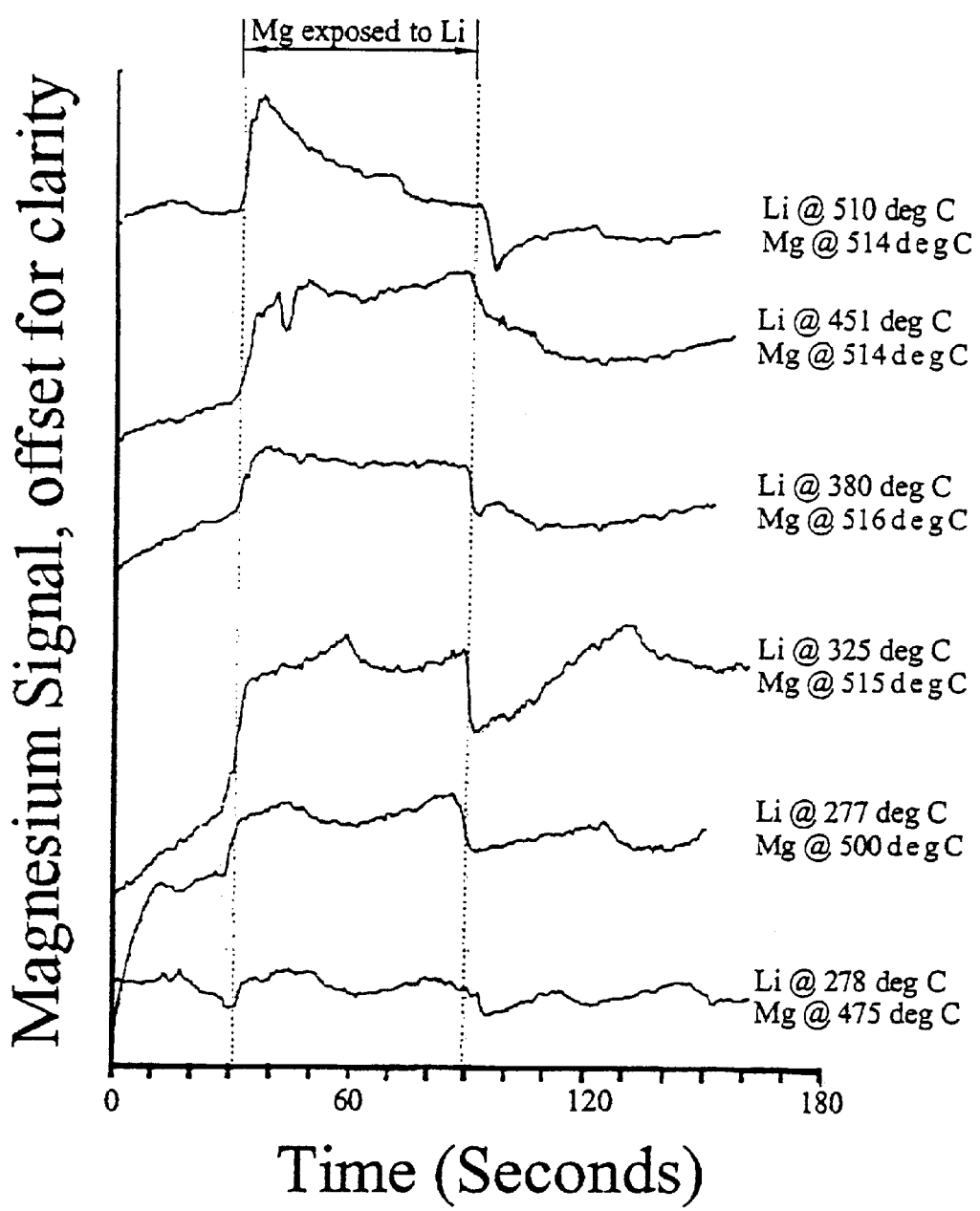
FIG. 15 is a diagram illustrating the magnesium flux signal as a function of variable magnesium surface temperature and impinging lithium beam flux temperature.

Using the configuration described in connection with FIG. 5, initial studies of the enhancement of the magnesium vaporization process due to the presence of lithium vapor have been made. The results of these studies are depicted in FIGS. 14 and 15. The studies suggest a definite temperature zone for the enhancement of the magnesium vaporization. As indicated in FIG. 5, the thermocouple 69 which measures the temperatures given for the magnesium in FIGS. 14 and 15 is located in a position behind the magnesium sheet 62. This thermocouple 69 measures a temperature between 25 and 40 degrees higher than that of the exposed front of the magnesium surface. From FIGS. 14 and 15, it is clear that there is a transition region at magnesium temperatures in the range between 450 and 500 degrees C. At lower magnesium temperatures, an impinging lithium flux suppresses the magnesium vaporization. As the transition region between suppressed and enhanced vaporization between 450 and 500 degrees C. is accessed, FIGS. 14 and 15 illustrate a fast interaction and response to the impinging lithium vapor.

FIG. 15 demonstrates that, as the lithium temperature and flux are raised over the range from approximately 278 to 510 degrees C., encompassing also the effective magnesium temperature range, an enhancement of the magnesium flux is observed during exposure for all but the highest lithium temperatures. Here, a progressive dropoff in intensity is observed for the period of exposure. At higher lithium temperatures the effects are even more dramatic. Similarly, as the magnesium temperature is raised for a given effective lithium temperature (FIG. 14) the enhancement of the magnesium signal is eventually lost. Thus, at higher lithium concentrations and magnesium temperatures, the vaporization of magnesium is suppressed or, at best, unaffected. A desired temperature range is indicated.

A similar behavior is observed for sodium. Because sodium and magnesium are virtually immiscible, the observed effect does not appear to be the product of a bulk diffusion. Rather, the results suggest that the evaporation-enhancement process is localized to the magnesium sheet surface and the first few monolayers below the surface. This appears to generate a mobile film of magnesium atoms that can mix intimately with lithium. These results might also correlate with previous observations of aluminum surface reconstruction resulting from alkali atom translation to the first few monolayers below the surface. The current results also suggest some transformation of the atomic lithium or sodium on or within the first few monolayers. At higher lithium concentrations, these effects may be suppressed by the formation of $Mg_xLi_y$ (y>x) agglomerates formed on the magnesium surface. At higher magnesium temperatures, the diffusion of lithium or sodium into the magnesium lattice might be inhibited as an increased energy is transferred to these alkali atoms as they diffuse along the surface. However, it is clear that, within a selected temperature zone, the evaporation of magnesium and the ready mixing of magnesium and lithium metal can be controlled to form magnesium-lithium alloys over a wide composition range.

Zinc-Lithium Film Generation

Zinc-lithium films were produced using containment vessel 300, shown in FIG. 3. Zinc rod (diameter 0.5"), zinc foil, and lithium rod (>98%) were purchased from Alfa Inorganics for use in these experiments. Lithium ribbons (0.38 mm thick, 99.9%) from Aldrich were used as reference and counter electrode for the electrochemical measurements. The Zn and Li sources were maintained at two different temperatures using the two independent control loops of an Omega CN3000 temperature controller. The maximum temperatures of the solid Zn disk and lithium metal in the KCVD configuration were 376 and 500° C., respectively. A Ta sheet, which acted as the deposition substrate for the Li and Zn vapor mixture, was cooled using dry ice-methanol slush (the temperature of the substrate was ~20° C.). The Li vapor pressure at the temperature of these experiments ranges from $\sim 10^{-3}$ to $10^{-2}$ Torr. Further experimental detail can be found in "Electrochemical Properties of Li—Zn Alloy Electrodes Prepared by Kinetically Controlled Vapor Deposition for Lithium Batteries", Electrochemical and Solid State Letters, 3, 312 (2000).

The microstructure and surface morphology of the Li—Zn alloys were characterized using a scanning electron microscope (SEM, Hitachi S-800). The alloys were then transferred under vacuum to a glove box (Vacuum Atmospheres Company), where a three-electrode electrochemical cell was employed for electrochemical measurements. The reference and the counter electrode were made of lithium foils and a 1M $LiN(SO_2CF_3)_2$-EC/DMC(1:2 by vol.) solution was used as the electrolyte. The apparent surface area of the alloy electrodes was 0.2 $cm^2$. Two layers of Celgard 2400 film were used as separators. The EC and DMC were dried for at least 24 h with activated 4A molecular sieves. Cyclic voltammetry and a galvanostatic intermittent titration technique (GITT) were performed using a Solatron 1285 system controlled by a personal computer.

Microstructure and Surface Morphology of a Li—Zn Alloy Prepared by KCVD

Figure 12:
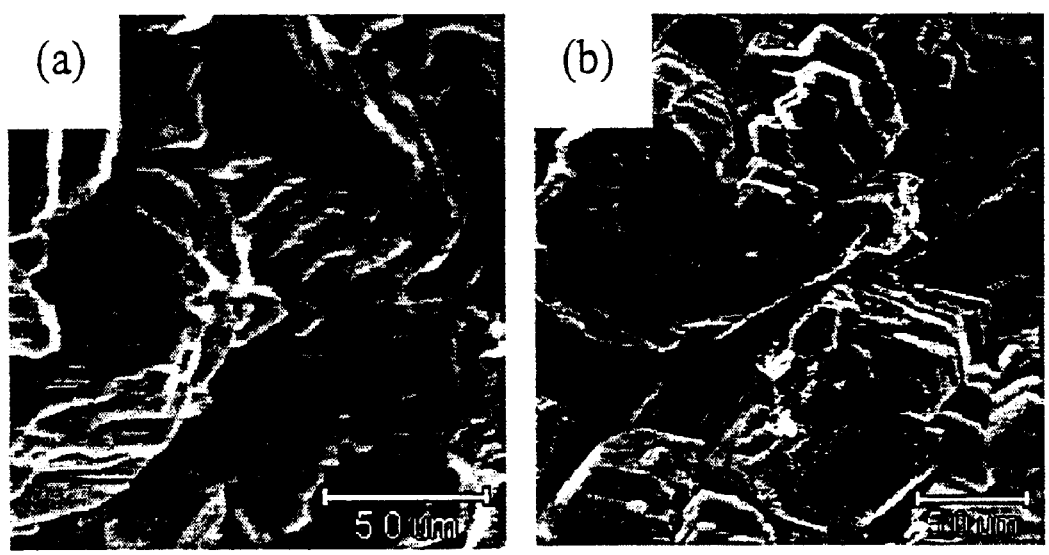
FIGS. 12A and 12B are Scanning Election micrographs of a lithium-zinc alloy.

Shown in FIGS. 12A and 12B are some typical SEM micrographs of a Li—Zn alloy electrode deposited on a Ta substrate seen from a top view and a side view, respectively. In contrast to the Li—Mg alloys prepared by a KCVD method, the Li—Zn sample does not display a columnar or a tapered structure. Instead, it consists of aggregate particles and displays a very porous structure. This, of course, is beneficial to the passage of liquid electrolyte into the pores to assist mass transfer; further, the real contact area between the liquid electrolyte and the Li—Zn alloy electrode surface will be increased when the alloy film is used as an anode in a lithium battery.

As demonstrated in the previously outlined study of Li—Mg alloys, the composition, microstructure, and morphology of the Li—Zn alloy films produced by the KCVD method can also be readily controlled through independent variation of the temperature of each source metal together with the temperature of the substrate. These microscopic features greatly influence the electrochemical properties of the alloy electrodes, as discussed elsewhere for Li—Mg electrodes.

Electrochemical Properties of a Li—Zn Alloy Prepared by KCVD

Figure 13:
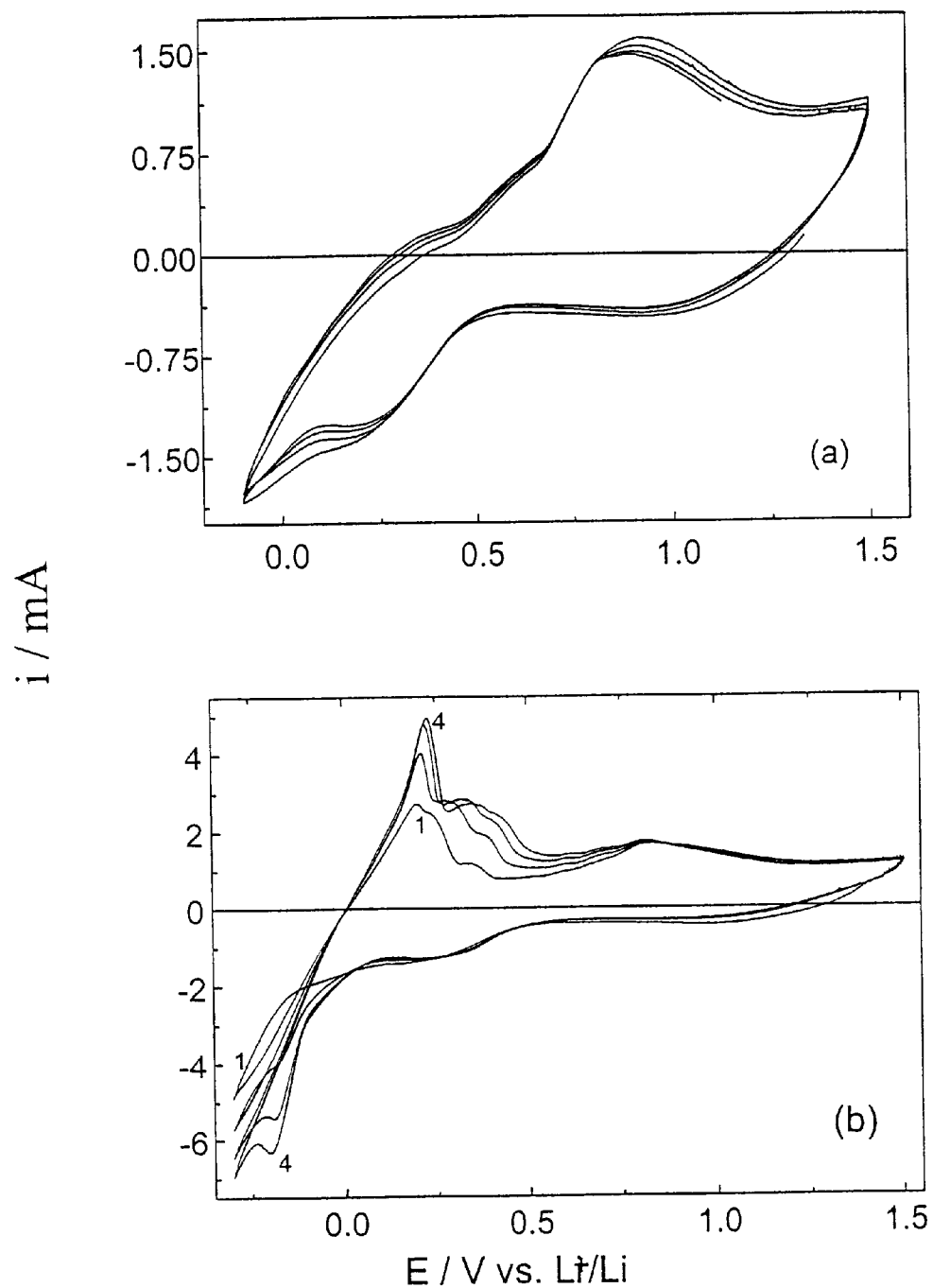
FIGS. 13A and 13B are cyclic voltagrams (CVs) of a lithium-zinc alloy

Shown in FIGS. 13A and 13B are the CVs of a Li—Zn alloy electrode prepared by the KCVD method. The CVs of the Li—Zn alloy, which had a thickness of 0.41 nm, were preformed in 1M $LiN(CF_3SO_2)_2$-EC/DMC (1:2 by volume) with a scan rate of 1 mV/s. These CV curves differ significantly from those observed on a pure Zn electrode or an electrodeposited Li—Zn alloy electrode. First, only one pair of redox peaks is observed in the potential range from 1.5 and −0.1 V, as shown in FIG. 13A, suggesting that the electrochemical behavior of the electrode is dominated by only one phase in the Li—Zn system or there is only one Li—Zn phase under these conditions. Second, when the potential was scanned to −0.1 V, no peaks corresponding to the deposition/stripping of pure Li were observed, implying that the filamentary and dendritic growths that usually are associated with pure Li have been essentially suppressed. These voltammagrams are indicative of a quite good cycling behavior of the alloy electrode.

When the potential limit in the anodic direction was lowered to −0.3 V, there was a small current ring in the first cycle, as shown in FIG. 13B; however, the current ring disappeared in subsequent cycles as a new cathodic peak appeared at about −0.18 V, corresponding to cathodic formation of another Li—Zn phase. This cathodic peak at about −0.8 V and the anodic peak at about 0.24 V represent another pair of redox peaks, corresponding to the alloying and de-alloying of Li into and from the LiZn phase in the Li—Zn system. The anodic peak corresponding to the $Li_2Zn_3$ phase (at about 0.3V) was also observable under these conditions.

The chemical diffusion coefficients of lithium into the Li—Zn alloy were also measured using the GITT. For the Li—Zn alloy prepared by the KCVD method, the diffusion coefficient of Li is about $4.7 \times 10^{-8}$ $cm^2/s$, which is one order of magnitude larger than those for the "LiZn" phase prepared by direct alloying, i.e., by melting appropriate amounts of the constituents together to form an alloy.

The observed electrochemical behavior of a Li—Zn alloy prepared by the KCVD method indicates that the tendency for Li dendrite formation is significantly reduced on such a Li—Zn alloy electrode. The measured diffusivity of Li in the Li—Zn alloy prepared by the KCVD method is much greater than those of Li—Zn alloys prepared by other techniques. Those skilled in the art will recognize that these observations suggest that Li—Zn alloys prepared by the KCVD method might be used to effectively prevent dendrite formation, thereby improving the cycleability of Li electrodes and the rechargeability of Li batteries as a result of their high diffusion coefficient.

Although the Li—Zn alloy electrode and the Li—Mg alloy electrode have been disclosed as being disposed on a Ta substrate, those skilled in the art will recognize that other choices for a substrate include, but are not limited to, a polymer, a polymer-electrolyte, nanoporous carbon, and nanoporous metal oxides including, but not limited to, $SnO_x$ and $TiO_x$ and metallic current collectors known to those skilled in the art. In one embodiment, the lithium alloy electrode is separated from the substrate after the lithium alloy has been deposited thereon.

Aluminum Surface Modification and the Aluminum-Lithium Alloy System

When applied to aluminum, the diffusion controlled lithiation process can produce three phases depending upon the extent of lithiation. One phase can be a saturated aluminum-lithium solid solution. The content of lithium in solution may be controlled by the time at temperature and the temperature. With prolonged exposures, the lithium content can exceed the solubility limit at the temperature of lithiation, and a second phase results—the equilibrium AlLi (δ) phase. Once the alloy is quenched, a third phase can also appear—the metastable Al$_3$Li (δ') phase. The δ' phase is the phase responsible for hardening.

At low lithiation levels, under conditions where the lithiation is carried out on a partially shielded aluminum substrate, the process produces a notable increase in the malleability of the original aluminum substrate as is apparent to the touch. Under similar conditions, in the absence of lithium, such an apparent increase in mallability does not occur. If the lithium vapor pressure is increased and the lithiation is carried further, under conditions where the aluminum lattice structure is closely preserved throughout the entire lithiation process, a partial lithiation of the aluminum occurs producing a sample of higher strength than the original aluminum substrate. Using the teachings of the present invention, alloys have been formed whose lithium content ranges from 0.2 to 5 weight percent lithium (ICP-AAS). The best results have been achieved using the configuration of FIG. 2B, when the aluminum plate 134 is heated to notably higher temperatures than the impinging lithium vapor 36.

The aluminum lithiation occurs over a narrow temperature range when the lithium vapor 36 is present at its surface. The optimum conditions for lithiation result when the aluminum disk is heated to 570–590° C. and the lithium vapor is maintained at temperatures between 525 and 585° C. for variable time frames. Thus, in order to produce a potentially useful product, the experiments require a very narrow range of temperature for the aluminum plate and a reasonably limited range of temperature for the lithium vapor. These conditions appear to promote a diffusion controlled surface lithiation when the system operates for time periods ranging between two and five hours depending on the precise experimental conditions. If these temperature ranges are exceeded, the lithiation process typically produces a sample in which too much lithium is dissolved. As a result, the overexposed sample is significantly embrittled.

The conversion to alloy especially at the aluminum disk 134 surface can be accomplished during the lithiation process. After annealing, the lithiated samples in the temperature range 500–550 degrees C., appear to be characterized by a series of interspersed, variably sized Al$_3$Li(δ') and AlLi(δ) phases. The presence of the δ' phase appears to be responsible for an increase in strength after lithiation. The lithiated samples are found to expand slightly as the introduction of lithium into the aluminum appears to increase the effective lattice constant over that of the bulk metal. If the lithium content of the alloy becomes too large (e.g., 5%), significant swelling of the aluminum substrate often occurs along with the formation of a significant volume fraction of the unwanted AlLi phase.

As previously mentioned, this process requires reasonably stringent control, especially of the aluminum temperature range. If the lithiation process is carried considerably further under conditions which correspond to a much higher level of lithium loading and the structural character of the aluminum lattice is not preserved, a series of partially water soluble lithium-aluminum (oxide) powders can be produced.

Formation of Copper-Lithium Alloys

As previously mentioned, when the invented procedure is applied to copper, a lithiation process can be carried out using the configuration depicted in FIG. 4A, to produce highly stable copper-lithium crystallites for which ICP studies indicate a Cu/Li ratio of 4 to 1 (Cu$_4$Li), confirmed by x-ray crystallography. Further, using a triple tandem copper substrate configuration mounted directly above a molten lithium sample as depicted in FIG. 4B, alloyed sheets may be prepared with Cu/Li ratios (ICP) ranging from 5 to 1 to 24 to 1, thereby suggesting that the composition of these alloys can also be widely and readily altered. In the saturation limit, copper lithium crystallites are again formed. Debye-Scherrer powder x-ray patterns obtained for these Cu/Li crystallites indicate an fcc lattice of lattice parameter 3.648 Å versus a corresponding 3.514 Å measured for the fcc lattice of the copper sample from which the lithiated sample was prepared. These copper-lithium alloy crystallites, which can be readily generated, are malleable yet not readily ground.

Suggested Mechanism for Enhancement of Magnesium Evaporation Rate

It is believed that the kinetics of diffusion, interaction, and reaction play a dominant role in the increase of the magnesium evaporation rate in the magnesium-lithium system as well as the observations in the copper-lithium system. Further, it should be understood that under the conditions of these experiments, an oxide coating is readily formed on the magnesium or copper substrates. It is likely that lithium must first interact with the oxide exposing the native magnesium or copper to further interaction. This could occur via the formation of Li$_2$O. Lithium might also inhibit the self passivation of the magnesium, thereby making more surface area available for evaporation.

While it might be argued that lithium in contact with magnesium would create a much lower melting point alloy on the surface of the magnesium thereby increasing the vapor pressure of the magnesium constituent, this seems inconsistent with the magnesium-lithium phase diagram and the temperature range over which the experiment is operative. At 700 K (427° C.), the Langmuir free evaporation flux is estimated to be approximately 2×10$^{22}$ Mg atoms/m$^2$-sec, assuming the magnesium vaporization coefficient to be unity. This value compares well with the flux expected upon vaporizing an approximately 1mm magnesium sheet in 30 minutes under the conditions of the illustrated experimental embodiment. This suggests that lithium indeed reacts to remove an inhibiting magnesium oxide coating and thus enhance vaporization from the magnesium surface.

Consider the diffusion of lithium into a bulk magnesium sample after removal of a significant component of the native oxide. Magnesium atoms binding in the bulk are sp hybridized (promoted). However, if lithium is allowed to diffuse into interstitial sites in close proximity to the promoted magnesium atoms, the exchange process

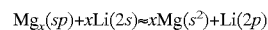

$$Mg_x(sp)+xLi(2s) \approx xMg(s^2)+Li(2p)$$

promoting the lithium and relaxing the magnesium to its ground state "s$^2$" configuration might occur. This, of course, creates a weakly bound magnesium atom which can readily escape from the bulk constituency. This model suggests a similar behavior for zinc, whose ground state atomic configuration is "d$^{10}$ s$^2$" and whose bonding in the bulk is sp hybridized. In fact, preliminary experiments indicate a very similar lithium mediated vaporization behavior for zinc. If lithium induces a change in hybridization through diffusion and interaction, the procedure may have more general validity to systems in which metals or metalloids are bound through promotion-hybridization in the bulk.

Applications to Lithium Battery Technology—the Magnesium-Lithium System

Among the various battery systems currently under research and development, lithium batteries (batteries using lithium or lithium-containing materials as the negative electrode) offer high energy and power densities. These batteries have already been widely used in microelectronic devices and improvements in their performance can significantly influence solid state device operation. The alloy generating techniques developed for the magnesium-lithium system and the ability to modify the nature of film deposition through substrate temperature control may impact on this development. Lithium alloy systems generated at room or lower temperature provide a means to obviate the problem of lithium dendrite formation, which inhibits the performance of a lithium electrode during charge/discharge cycling. Further, the capacity of a system developed using magnesium-lithium alloys might considerably exceed that of currently accessible lithiated carbon electrodes.

As previously described, the cyclability of lithium electrodes (and hence their rechargability) represents a critical problem as lithium atoms electrodeposited at the interface between a lithium electrode and an electrolyte during recharge tend to form lithium dendrites. Dendrite growth progresses during cycling and often leads to an open circuit and electrical isolation of active lithium, decreasing power density, or to electrical shorting between the electrodes and subsequent battery failure. In order to prevent dendrite formation, lithium-containing materials have been studied to replace pure lithium in an effort to reduce its activity to a value less than unity. Prior to the present invention, lithium ion batteries, which employ lithiated carbon as a host lattice for lithium, appeared to be the most successful at preventing dendrite formation. However, the obtainable capacity for these lithiated carbon electrodes is only about 339 mAh/g, if we consider the current reversible insertion and extraction of 1 lithium atom per 6 carbon atoms. Reversible insertion of lithium into carbon up to the equivalent of 2 lithium atoms per 6 carbon atoms may achieve a capacity of 623 mAh/g. This potential capacity might be considerably exceeded by lithium alloy electrodes generated using the techniques we have developed for the magnesium-lithium system.

Lithium alloy electrodes not only can provide a high rate capability but also show an excellent potential to offer a higher energy density than lithiated carbon electrodes. The capacity of a beta-phase Li—Mg alloy electrode can be as high as 1.83 Ah/g if the electrode is cycled with no phase change in the composition range from $Li_3Mg_7$ to $Li_8Mg_2$ or 642 mAh/g if it is cycled from $Li_4Mg_6$ to $Li_6Mg_4$. In the latter case, the atomic fraction of lithium is changed from 40% to 60% and, the electrode reaction can be topotactic. In this case, the maintenance of the structure and microstructure of the alloy, as fabricated, have a significant effect on electrochemical performance. Further, the transport of a lithium atom in the extensive beta-phase of a Li—Mg alloy appears to be quite rapid. The diffusivity at 420° C. has been reported as a substantial $1.8~5.0\times10^{-6}$ cm$^2$/s, suggesting a significant diffusivity at room temperature. In contrast, lithiated carbon electrodes possess a limited rate capability as the reported diffusivity of lithium ions in $Li_xC_6$ at 25 degrees C. is approximately $10^{-8}$ to $10^{-9}$ cm$^2$/second, depending upon the degree of lithiation.

In order to reduce the formation of lithium dendrites during recharging, the alloy or microstructure used should efficiently transport lithium away from the electrode surface and back into the alloy. This process may be controlled by the diffusion of lithium in alloy. Here, it is important to note that controlling bulk diffusion by composition modifications is not the only way to alter the diffusion process. FIG. 7 illustrates the dramatic effect substrate temperature has on the morphology of a deposited lithium-magnesium alloy film. The decrease in temperature from 375 degrees C. to near room temperature transforms coarse grains to columnar and a further reduction in substrate temperature results in independent columns with open channels between them. These channels can be used to enhance the diffusion at the electrode surface preventing lithium accumulation and subsequent dendrite growth. In addition to the shape of the columnar structure being affected by temperature, the number of columns per unit area increases. Thus surface diffusion can become a dominant mechanism for lithium diffusion.

Applications to Aluminum-Lithium Alloy Fabrication

The goal of aluminum-lithium alloy development programs within the aerospace industry has been to provide alternative alloys with lower densities than those alloys currently used but without sacrificing strength, fracture toughness, ductility, and corrosion resistance. While much insight has been gained in the last two decades regarding the relationships between microstructure and properties, the commercial production of an aluminum-lithium alloy with consistent, acceptable engineering properties is only now slowly developing. The difficulties in maintaining properties during commercial production of an aluminum-lithium alloy are exacerbated by the reactive nature of the molten alloy. When lithium is added to molten aluminum the melt becomes more reactive than a conventional aluminum alloy and special crucibles and furnace linings are required. Furthermore, the reactive nature of lithium with the gaseous environment requires special precautions with respect to nitrogen, oxygen, and carbon containing gases.

The procedure introduced here is distinct, in that it can permit the introduction of the reactive element, lithium, into aluminum or an aluminum alloy at or near the final stage in the production of a wrought product. The significance of the approach is that one might completely prepare and process the metal or alloy of interest and then, in the final stages of preparation, carry out the lithiation process followed by an annealing cycle. If a solid state homogenization process is utilized, the major application of the technique is to thin sheet processing, however, the technique can also be particularly useful when it is desirable to deposit excess lithium onto the surface of a wrought Al—Li alloy product. During the long thermal cycles used for homogenizing and hot working of commercial aluminum-lithium alloys, a lithium depleted region is created at the surface. Further, it has been shown that aluminum alloys containing lithium are far more susceptible to surface oxidation during processing than other non-lithium aluminum alloys. Consequently, the development of a post thermal mechanical lithiation process to replenish the depleted lithium level, while minimizing the degree of oxidation, can have important implications for the use of aluminum-lithium alloys.

Improved Alkali Promoted Metal Oxide Catalysts

Kinetically controlled lithiation as applied to produce the intimate mixing of magnesium and lithium at variable concentrations and form alloys of $Mg_xLi_y$ composition can be modified to introduce lithium into magnesium/magnesium oxide (MgO) mixtures in the presence of oxygen or into commercially available $MgO_x$, aided by solid state diffusion, to form lithiated magnesia constituencies of large surface area across a broad composition range. This technique thus shows promise for improving selective alkali promoted magnesia catalysts as well as a variety of additional metal oxide based catalytic constituencies.

Basic metal oxides containing a variety of dopants have shown promise for the oxidative coupling (partial oxidation) of methane to $C_{2+}$, hydrocarbons, primarily ethylene and ethane. Among these, the alkali doped alkaline earth oxides have been used, with the Li/MgO and Na/CaO systems found to be active and highly selective. However, it is desirable to improve the conversion efficiency of these systems. Improved variants of these catalysts might be synthesized employing the process, described herein, of kinetically controlled lithiation (also extended to sodiation), to modify the nature of the alkali/metal oxide base and enhance surface area. Further, the selectivity of these alkali/metal oxide catalysts can be increased by adding small amounts of zinc to the base constituency. This can be accomplished with a post treatment with zinc employing very similar configurations to those required to accomplish the kinetically controlled lithiation process.

As is known, lithium doped magnesium oxide (Li/MgO) in the presence of $O_2$ shows a high activity for abstracting H from $CH_4$ to form $CH_3$ radicals. $C_2H_6$ and $C_2H_4$ are produced in high yield in what appears to be a coupling of two gaseous $CH_3$ radicals formed on the catalyst. The $CH_3$ radicals are believed to be formed at ($Li^+O^-$) centres on MgO. Gas phase and surface studies indicate that $O^-$ ions efficiently abstract H from $CH_4$. Because the Li/MgO catalyst does not contain ions having variable oxidation states or consist of transition metals it facilitates radical generation without subsequent catalyst-radical reaction.

Powder catalysts of Li/MgO containing up to 7 wt % Li have been prepared from $Li_2CO_3$ and MgO and then activated in an $O_2$ flow at 465 degrees C. Catalytic evaluations, generally performed at 1 atmosphere pressure in a conventional flow reactor, with $O_2/CH_4$ reactant ratios close to 0.5 passed over 7% Li/MgO at 720 degrees C., show high $C_{2+}$, compound yields (See Table IV below). By comparison, under similar conditions, a pure MgO catalyst prepared in a similar fashion is much less selective. It should also be noted that similar experiments have been performed on Na/MgO, K/MgO, and Na/CaO catalysts, at much higher weight percentage alkali metal, with variable results. The Na/CaO system, for example, displays a clear optimum at approximately 15 weight percentage Na, dropping to minimal activity at approximately 43 weight percent. Although, the origin of this dropoff is not well understood, it may result from the incomplete diffusion of the sodium constituency to the CaO interface. This, of course, can be considerably improved with the ready diffusion of lithium. In fact, it is surprising that higher weight percentage lithium loadings have not been attempted.

Using the techniques which have been developed for kinetically controlled lithiation, it should be possible to considerably increase the level of lithium on MgO. This can result from both the enhanced intimate gas phase mixing of lithium and Mg/MgO constituencies as well as an enhanced solid state diffusion of lithium/$O_2$ combinations into magnesium/magnesium oxide mixtures. In effect, the seeding level and range of the alkali promoter can be increased, as well as the catalyst surface area. Given the uncertainty as to whether the methyl radical combination occurs strictly in the gas phase or, in part, on the catalyst surface, the kinetically controlled preparation of a large surface area catalyst might considerably improve both methyl group formation and $CH_3$—$CH^3$combination. Further, a catalyst may be produced which is effective at temperatures considerably lower than 720 degrees C.

The techniques which we outline are not limited to the Li/MgO system. For example, $CeO_2$ reacts extensively with methyl radicals and is a good catalyst for the complete oxidation of methane. The addition of 0.9 weight percentage $Li^+$ drastically reduces the reaction efficiency (93 to 16% at 470 degrees C.) while the catalyst becomes selective for ethane and ethylene. Our preparation techniques might well demonstrate means to improve the efficiency. In addition, there are at least three commercially important chemical process areas which can potentially benefit from an improved catalyst technology where alkali metals supported on metal oxides have played prominent roles.

(1) Isobutyl benzene which is a key component in the manufacture of Ibuprofen is produced commercially through toluene propylation over a supported alkali metal (K typically).

(2) Di-methylnaphthalene is manufactured using a basic metal oxide catalyst to produce pentylenyl toluene from butadiene and o-xylene.

(3) Basic metal oxide catalysts are used commercially to produce 4 methyl-1-pentene. This is an important co-monomer for the production of polyethylene co-polymers.

It may also, in some instances, be desirable to introduce small quantities of zinc onto the surface of these catalysts. This is also possible with the lithiation process described herein.

The foregoing description has been presented for purposes of illustration and description. It is not intended to be exhaustive or to limit the invention to the precise forms disclosed. Obvious modifications or variations are possible in light of the above teachings. The embodiment or embodiments discussed were chosen and described to provide the

TABLE IV

Results for the Partial Oxidation of Methane
Li (7 %)/MgO[a]

| Run | Reactants | | Products | | | | Conversion | $C_2$ Selectivity | $C_2$ Yield |
| | $CH_4$ | $O_2$ | $CO_2$ | CO | $C_2H_4$ | $C_2H_6$ | % | % | % |
|---|---|---|---|---|---|---|---|---|---|
| 1 | 59[b] | 29[b] | 11.2 | 0.0 | 3.5 | 2.2 | 37.8 | 50.3 | 19 |
| 2 | 58 | 36 | 13.7 | 0.2 | 3.7 | 2.1 | 42.8 | 45.4 | 19.4 |
| 3 | 89 | 29 | 11.1 | 0.0 | 4.6 | 3.1 | 29.1 | 58.1 | 16.9 |
| 4 | 218 | 117 | 51.2 | 1.5 | 15.4 | 7.4 | 37.5 | 46.5 | 17.4 |

[a]At 720 degrees C. over Li/MgO
[b]Partial pressures given in Torr best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. An electrode material for use in a rechargeable battery, the electrode comprising a lithium alloy having a first surface and an opposed external surface, the external surface defining pores that extend generally inward from the external surface towards the first surface, wherein the pores of the external surface enhance lithium diffusion, whereby the enhanced lithium diffusion inhibits dendritic growth of lithium from the external surface of the lithium alloy during the use of the battery.

2. An electrode material for use in a rechargeable battery, the electrode comprising a lithium alloy having a porous surface that enhances lithium diffusion, whereby the enhanced lithium diffusion inhibits dendritic growth of lithium from the surface of the lithium alloy during the use of the battery, wherein the lithium alloy is produced from the process of:

vaporizing at least a portion of a mass of lithium;

disposing at least one lithium soluble material in the lithium vapor, wherein the lithium vapor promotes the vaporization of the at least one lithium soluble material, thereby creating a combined vapor; and disposing a substrate in the combined vapor, whereby the combined vapor is deposited on the substrate.

3. The electrode material of claim 2, wherein the process further includes the step of controlling the ratio of lithium to the at least one lithium soluble material in the combined vapor.

4. The electrode material of claim 3, wherein the ratio of the combined vapor is controlled by independently controlling the temperature of the mass of lithium and the at least one lithium soluble material.

5. The electrode material of claim 4, wherein the temperature of the mass of lithium is controlled within the range of approximately 350 degrees Celsius to 655 degrees Celsius.

6. The electrode material of claim 4, wherein the mass of lithium is disposed in a crucible, and the crucible is heated to a temperature that promotes the vaporization of the mass of lithium.

7. The electrode material of claim 6, wherein the crucible is heated to a temperature of at least the approximate lithium sublimation temperature.

8. The electrode material of claim 4, wherein the process further includes the step of independently controlling the temperature of the substrate to control the morphology of the lithium alloy deposited on the substrate.

9. The electrode material of claim 8, wherein the temperature of the substrate is in an appropriate range of approximately 10 degrees Celsius to 70 degrees Celsius.

10. The electrode material of claim 8, wherein the at least one lithium soluble material is selected from the group consisting of magnesium, silicon, silver, tin, copper, and zinc.

11. The electrode material of claim 10, wherein the content of lithium in the lithium alloy is approximately 20 to 90 molar percent.

12. The electrode material of claim 11, wherein the at least one lithium soluble material is magnesium, and the magnesium is temperature controlled within the range of approximately 440 degrees Celsius to 530 degrees Celsius.

13. An electrode for use in a rechargeable battery, the electrode comprising:

a lithium alloy having a first surface and an opposed external surface, the external surface defining pores that extend generally inward from the external surface towards the first surface, the lithium alloy comprising lithium and at least one lithium soluble material, wherein the pores of the external surface of the alloy enhance lithium diffusion, which inhibits dendritic growth of lithium from the external surface of the lithium alloy during recharging of the battery; and a substrate having the first surface of the lithium alloy disposed thereon.

14. The electrode of claim 13, wherein the at least one lithium soluble material is selected from the group magnesium, silicon, tin, copper, and zinc.

15. An electrode for use in a rechargeable battery, the electrode comprising:

a lithium alloy having a porous surface, the lithium alloy comprising lithium and at least one lithium soluble material, wherein the porous surface of the alloy enhances lithium diffusion, which inhibits dendritic growth of lithium from the surface of the lithium alloy during recharging of the battery; and a substrate having the lithium alloy disposed thereon, wherein the at least one lithium soluble material is selected from the group magnesium, silicon, tin, copper, and zinc, and wherein the lithium content of the lithium alloy is approximately 20 to 90 weight percent.

16. The electrode of claim 15, wherein the lithium alloy is deposited on a temperature controlled substrate by disposing the temperature controlled substrate in a mixed vapor of lithium and at least one soluble material, whereby the morphology of the lithium alloy is controlled by the temperature of the substrate.

17. The electrode of claim 16, wherein the temperature of the substrate is controlled within the range of approximately 10 degrees Celsius to 70 degrees Celsius.

18. The electrode of claim 16, wherein the substrate is selected from the group of polymers, polymer-electrolytes, metallic current collectors, and nanoporous materials including carbon, metal and metal oxides.

19. The electrode material of claim 1, wherein the lithium alloy is produced from the process of:

vaporizing at least a portion of a mass of lithium;

disposing at least one lithium soluble material in the lithium vapor, wherein the lithium vapor promotes the vaporization of the at least one lithium soluble material, thereby creating a combined vapor; and disposing a substrate in the combined vapor, whereby the combined vapor is deposited on the substrate.

20. The electrode material of claim 19, wherein the process further includes the step of controlling the ratio of lithium to the at least one lithium soluble material in the combined vapor.

21. The electrode material of claim 20, wherein the ratio of the combined vapor is controlled by independently controlling the temperature of the mass of lithium and the at least one lithium soluble material.

22. The electrode material of claim 21, wherein the temperature of the mass of lithium is controlled within the range of approximately 350 degrees Celsius to 655 degrees Celsius.

23. The electrode material of claim 21, wherein the mass of lithium is disposed in a crucible, and the crucible is heated to a temperature that promotes the vaporization of the mass of lithium.

24. The electrode material of claim 23, wherein the crucible is heated to a temperature of at least the approximate lithium sublimation temperature.

25. The electrode material of claim 21, wherein the process further includes the step of independently controlling the temperature of the substrate to control the morphology of the lithium alloy deposited on the substrate.

26. The electrode material of claim 25, wherein the temperature of the substrate is in an appropriate range of approximately 10 degrees Celsius to 70 degrees Celsius.

27. The electrode material of claim 25, wherein the at least one lithium soluble material is selected from the group consisting of magnesium, silicon, silver, tin, copper, and zinc.

28. The electrode material of claim 27, wherein the content of lithium in the lithium alloy is approximately 20 to 90 molar percent.

29. The electrode material of claim 28, wherein the at least one lithium soluble material is magnesium, and the magnesium is temperature controlled within the range of approximately 440 degrees Celsius to 530 degrees Celsius.

30. The electrode of claim 13, wherein the lithium content of the lithium alloy is approximately 20 to 90 weight percent.

31. The electrode of claim 30, wherein the lithium alloy is deposited on a temperature controlled substrate by disposing the temperature controlled substrate in a mixed vapor of lithium and at least one soluble material, whereby the morphology of the lithium alloy is controlled by the temperature of the substrate.

32. The electrode of claim 31, wherein the temperature of the substrate is controlled within the range of approximately 10 degrees Celsius to 70 degrees Celsius.

33. The electrode of claim 31, wherein the substrate is selected from the group of polymers, polymer-electrolytes, metallic current collectors, and nanoporous materials including carbon, metal and metal oxides.

* * * * *